(12) United States Patent   (10) Patent No.: US 9,308,559 B2
Amano                            (45) Date of Patent: *Apr. 12, 2016

(54) SUBSTRATE PROCESSING APPARATUS, SUBSTRATE PROCESSING METHOD AND STORAGE MEDIUM

(71) Applicant: TOKYO ELECTRON LIMITED, Tokyo (JP)

(72) Inventor: Yoshifumi Amano, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 579 days.

This patent is subject to a terminal disclaimer.

(21) Appl. No.: 13/711,784

(22) Filed: Dec. 12, 2012

(65) Prior Publication Data

US 2013/0152976 A1    Jun. 20, 2013

(30) Foreign Application Priority Data

Dec. 16, 2011  (JP) ................................ 2011-276324

(51) Int. Cl.
 *B08B 3/00*   (2006.01)
 *B08B 3/04*   (2006.01)
 *H01L 21/67*  (2006.01)

(52) U.S. Cl.
 CPC ............ *B08B 3/04* (2013.01); *H01L 21/67051* (2013.01)

(58) Field of Classification Search
 None
 See application file for complete search history.

(56) References Cited

U.S. PATENT DOCUMENTS

| 5,939,139 | A  | * | 8/1999 | Fujimoto ...................... 427/240 |
| 6,019,843 | A  | * | 2/2000 | Park et al. ...................... 118/52 |
| 2006/0180968 | A1 | * | 8/2006 | Kim et al. ...................... 269/51 |
| 2008/0023034 | A1 | * | 1/2008 | Hirao et al. ...................... 134/11 |
| 2013/0156948 | A1 | * | 6/2013 | Amano ...................... 427/240 |

FOREIGN PATENT DOCUMENTS

| CN | 1672245 A     | 9/2005  |
| CN | 1737692 A     | 2/2006  |
| CN | 1879199 A     | 12/2006 |
| JP | H08-061064 A  | 3/1996  |
| JP | 2011-135014 A | 7/2011  |

* cited by examiner

*Primary Examiner* — Eric Golightly
(74) *Attorney, Agent, or Firm* — Abelman, Frayne & Schwab

(57) ABSTRACT

Provided is a substrate processing apparatus including a substrate holding unit configured to hold a wafer W horizontally, a rotation driving unit configured to rotate the substrate holding unit, a first chemical liquid nozzle configured to discharge a first chemical liquid to a first chemical liquid supplying position on the peripheral portion of the wafer W, and a second chemical liquid nozzle configured to discharge a second chemical liquid to a second chemical liquid supplying position on the peripheral portion of the wafer W. The rotation driving unit rotates the substrate holding unit in a first rotation direction when the first chemical liquid nozzle discharges the first chemical liquid, and rotates the substrate holding unit in a second rotation direction when the second chemical liquid nozzle discharges the second chemical liquid.

15 Claims, 15 Drawing Sheets

SUBSTRATE PROCESSING APPARATUS, SUBSTRATE PROCESSING METHOD AND STORAGE MEDIUM

CROSS-REFERENCE TO RELATED APPLICATIONS

This application is based on and claims priority from Japanese Patent Application No. 2011-276324, filed on Dec. 16, 2011, with the Japanese Patent Office, the disclosure of which is incorporated herein in its entirety by reference.

TECHNICAL FIELD

The present disclosure relates to a substrate processing apparatus and a substrate processing method that perform a liquid processing for a substrate while rotating the substrate in a state where the substrate is held in a horizontal direction. The present disclosure also relates to a storage medium that stores a computer program that, when executed, causes a computer to perform the substrate processing method in the substrate processing apparatus.

BACKGROUND

A single wafer processing type liquid processing is included in manufacturing processes of semiconductor devices in which a substrate is held to be freely rotatable about a vertical axis and various chemical liquids are supplied onto the surface of the substrate while rotating the substrate. In the liquid processing using the chemical liquids, different chemical liquids are appropriately used according to the processing purposes.

For example, Japanese Patent Application Laid-Open No. 2011-135014 discloses a substrate processing apparatus that includes a nozzle. The nozzle includes: a first chemical liquid discharging port that discharges a first chemical liquid toward the peripheral portion of a substrate; and a second chemical liquid discharging port that discharges a second chemical liquid toward the peripheral portion of the substrate. Examples of the first chemical liquid and the second chemical liquid includes, for example, at least one of a sulfuric acid, an acetic acid, a nitric acid, a hydrochloric acid, a hydrofluoric acid, an ammonia solution, a hydrogen peroxide, a phosphoric acid, an organic acid (e.g., a citric acid, an oxalic acid), an organic alkali (e.g., a tetramethylammonium hydroxide (TMAH)), a surfactant, and an anticorrosive agent.

In Japanese Patent Application Laid-Open No. 2011-135014, the nozzle is configured such that the first chemical liquid supplied to the nozzle is supplied to a first chemical liquid supplying port via a first chemical liquid flow path and the second chemical liquid supplied to the nozzle is supplied to a second chemical liquid supplying port via a second chemical liquid flow path. With the configuration of the nozzle, the first chemical liquid and the second chemical liquid are prevented from being mixed with each other within the nozzle.

SUMMARY

The present disclosure provides a substrate processing apparatus including: a substrate holding unit configured to hold a substrate in a horizontal direction to perform a liquid processing for a peripheral portion of the substrate by a chemical liquid; a rotation driving unit configured to rotate the substrate holding unit to perform the liquid processing while rotating the substrate held by the substrate holding unit in a horizontal direction; a first chemical liquid nozzle configured to discharge a first chemical liquid to a first chemical liquid supplying position on the peripheral portion of the substrate; and a second chemical liquid nozzle configured to discharge a second chemical liquid to a second chemical liquid supplying position on the peripheral portion of the substrate. The rotation driving unit rotates the substrate holding unit in a first rotation direction when the first chemical liquid nozzle discharges the first chemical liquid, and rotates the substrate holding unit in a second rotation direction, which is opposite to the first rotation direction, when the second chemical liquid nozzle discharges the second chemical liquid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
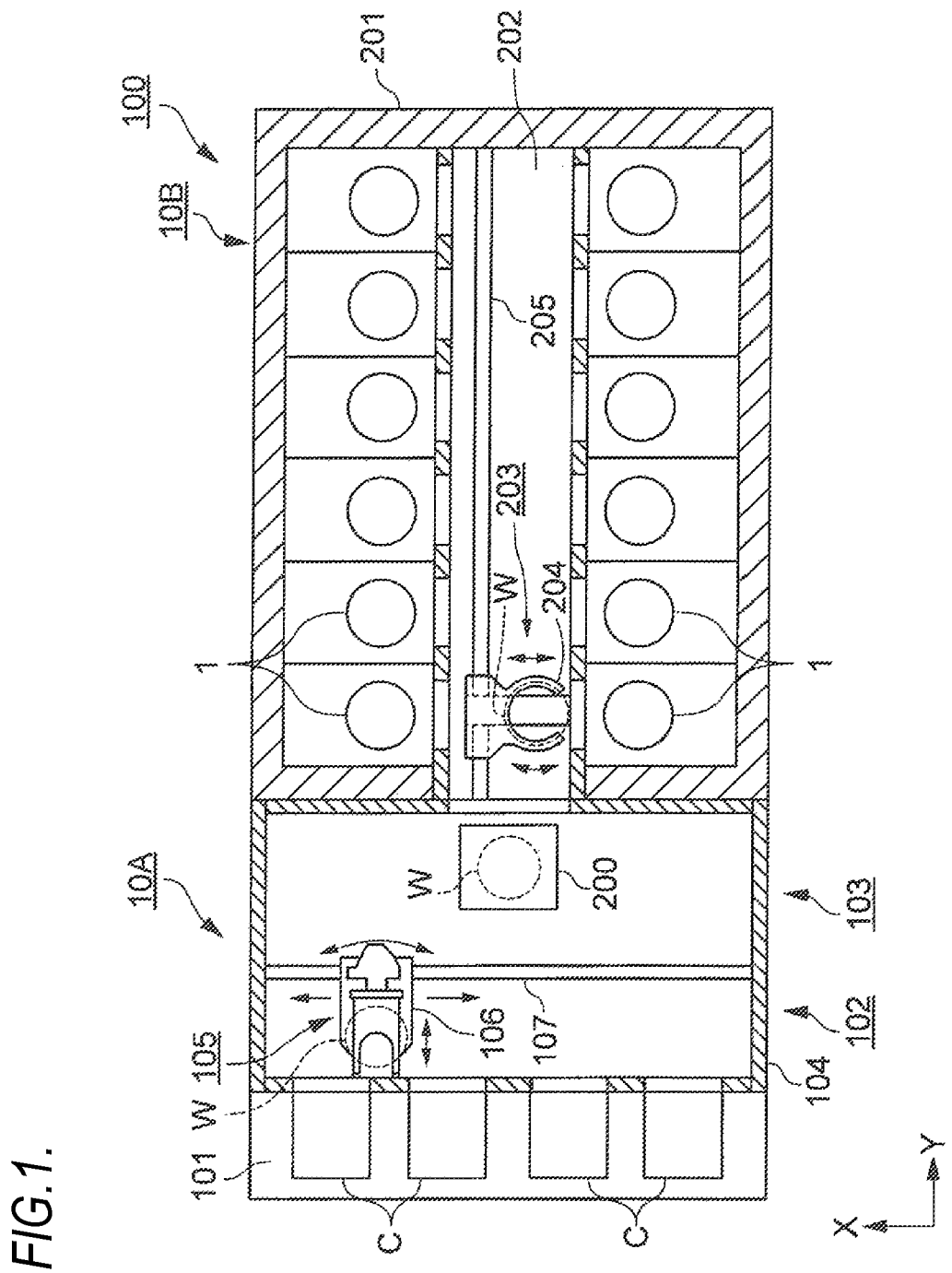
FIG. 1 is a plan view illustrating a schematic configuration of a substrate processing system including a substrate processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The first chemical liquid and the second chemical liquid discharged from the nozzle collide with the substrate in a predetermined speed. In this case, the chemical liquid collided with the substrate may be splashed to return from the substrate and the splashed chemical liquid may be adhered to the nozzle. Further, it may be also considered that the chemical liquid already existed on the substrate may be splashed because of the collision energy. Herein, when the first chemical liquid discharging port and the second chemical liquid discharging port are formed in a single nozzle as in Japanese Patent Application Laid-Open No. 2011-135014 as described above, the first chemical liquid which was splashed to return or splashed from the substrate may be adhered to the second chemical liquid discharging port, or the second chemical liquid which was splashed to return or splashed from the substrate may be adhered to the first chemical liquid discharging port, and thus, the first chemical liquid and the second chemical liquid are mixed with each other. When the different chemical liquids are mixed in this way, foreign substances or gases may be generated because of a chemical reaction, and thus, the substrate may be contaminated.

The present disclosure has been made in an effort to provide a substrate processing apparatus, a substrate processing method and a storage medium capable of effectively solving the problems as described above.

An aspect of the present disclosure provides a substrate processing apparatus including: a substrate holding unit configured to hold a substrate in a horizontal direction to perform a liquid processing for a peripheral portion of the substrate by a chemical liquid; a rotation driving unit configured to rotate the substrate holding unit to perform the liquid processing while rotating the substrate held by the substrate holding unit in a horizontal direction; a first chemical liquid nozzle configured to discharge a first chemical liquid to a first chemical liquid supplying position on the peripheral portion of the substrate; and a second chemical liquid nozzle configured to discharge a second chemical liquid to a second chemical liquid supplying position on the peripheral portion of the substrate. The rotation driving unit rotates the substrate holding unit in a first rotation direction when the first chemical liquid nozzle discharges the first chemical liquid, and rotates the substrate holding unit in a second rotation direction, which is opposite to the first rotation direction, when the second chemical liquid nozzle discharges the second chemical liquid.

In the above-described substrate processing apparatus, the central angle formed by connecting a center of the substrate, a central point of the first chemical liquid supplying position and a central point of the second chemical liquid supplying position becomes more than 180 degrees, when the central angle is viewed along the first rotation direction with respect to the first chemical liquid supplying position as a reference.

In the above-described substrate processing apparatus, the first chemical liquid nozzle is configured such that a discharging direction of the first chemical liquid to be discharged is inclined into the first rotation direction, and the second chemical liquid nozzle is configured such that a discharging direction of the second chemical liquid to be discharged is inclined into the second rotation direction.

In the above-described substrate processing apparatus, the first chemical liquid nozzle and the second chemical liquid nozzle are configured such that the discharging directions of the first chemical liquid and the second chemical liquid to be discharged have a component toward the outside of the radial direction of the substrate, respectively.

In the above-described substrate processing apparatus, the first chemical liquid nozzle and the second chemical liquid nozzle are arranged to discharge the first chemical liquid and the second chemical liquid toward the top surface of the substrate, respectively. The substrate processing apparatus further includes: a first chemical liquid discharging port configured to discharge the first chemical liquid to a third chemical liquid supplying position on the bottom surface of the substrate; and a second chemical liquid discharging port configured to discharge the second chemical liquid to a fourth chemical liquid supplying position on the bottom surface of the substrate. The third chemical liquid supplying position is located at a downstream side along the first rotation direction with respect to the first chemical liquid supplying position, with the substrate interposed therebetween, and the fourth chemical liquid supplying position is located at a downstream side along the second rotation direction with respect to the second chemical liquid supplying position, with the substrate interposed therebetween.

The above-described substrate processing apparatus further includes a cup body including: a ring shaped liquid receiving space configured to receive the first chemical liquid and the second chemical liquid scattered from the substrate; and a drain port configured to discharge the first chemical liquid and/or the second chemical liquid. A bottom surface of the cup body is constituted by a liquid receiving bottom surface which is inclined downwardly toward the drain port, and the liquid receiving bottom surface has a highest position between a position corresponding to the first chemical liquid supplying position and a position corresponding to the second chemical liquid supplying position, and is inclined downwardly from the highest position along the first rotation direction and the second rotation direction.

In the above-described substrate processing apparatus, a carrier liquid supplying port configured to supply a carrier liquid is formed in the highest position of the liquid receiving bottom surface.

The above-described substrate processing apparatus further includes a cover member configured to face the top surface of the substrate with a space therebetween. The first chemical liquid nozzle and the second chemical liquid nozzle are adhered to the cover member.

The above-described substrate processing apparatus further includes a first cleaning liquid discharging port and a second cleaning liquid discharging port which are configured to discharge a cleaning liquid toward the first chemical liquid nozzle and the second chemical liquid nozzle, respectively.

The above-described substrate processing apparatus further includes a nozzle driving unit configured to move the first chemical liquid nozzle and the second chemical liquid nozzle in a horizontal direction. While discharging the first chemical liquid and the second chemical liquid, the first chemical liquid nozzle and the second chemical liquid nozzle move from the outside of the substrate to positions where the first chemical liquid and the second chemical liquid are discharged toward the first chemical liquid supplying position and the second chemical liquid supplying position, respectively.

Another aspect of the present disclosure provides a substrate processing method including: rotating a substrate holding unit that holds a substrate in a horizontal direction in a first rotation direction; discharging a first chemical liquid to a first chemical liquid supplying position on the peripheral portion of the substrate by a first chemical liquid nozzle when the substrate holding unit is rotated in the first rotation direction, thereby performing a liquid processing for the peripheral portion of the substrate by the first chemical liquid while rotating the substrate held by the substrate holding unit in the first rotation direction; rotating the substrate holding unit in a second rotation direction which is opposite to the first rotation direction; and discharging a second chemical liquid to a second chemical liquid supplying position on the peripheral portion of the substrate by a second chemical liquid nozzle when the substrate holding unit is rotated in the second rotation direction, thereby performing the liquid processing for the peripheral portion of the substrate by the second chemical liquid while rotating the substrate held by the substrate holding unit in the second rotation direction.

In the above-described substrate processing method, the central angle formed by connecting the center of the substrate, the central point of the first chemical liquid supplying position and the central point of the second chemical liquid supplying position becomes more than 180 degrees, when the central angle is viewed along the first rotation direction with respect to the first chemical liquid supplying position as a reference.

In the above-described substrate processing method, while discharging the first chemical liquid, the first chemical liquid nozzle moves from the outside of the substrate to a position where the first chemical liquid is discharged into the first chemical liquid supplying position, when the first chemical liquid is discharged to the first chemical liquid supplying position of the peripheral portion of the substrate.

In the above-described substrate processing method, the first chemical liquid nozzle and the second chemical liquid nozzle are arranged to discharge the first chemical liquid and the second chemical liquid toward the top surface of the substrate, respectively. The substrate processing method further includes: discharging the first chemical liquid to a third chemical liquid supplying position on the bottom surface of the substrate when the first chemical liquid nozzle discharges the first chemical liquid; and discharging the second chemical liquid to a fourth chemical liquid supplying position on the bottom surface of the substrate when the second chemical liquid nozzle discharges the second chemical liquid. The third chemical liquid supplying position is located at a downstream side along the first rotation direction with respect to the first chemical liquid supplying position, with the substrate interposed therebetween, and the fourth chemical liquid supplying position is located at a downstream side along the second rotation direction with respect to the second chemical liquid supplying position, with the substrate interposed therebetween.

Even another aspect of the present disclosure provides a storage medium that stores a computer program that, when executed, causes a computer to perform a substrate processing method in a substrate processing apparatus. The substrate processing method includes: rotating a substrate holding unit that holds a substrate in a horizontal direction in a first rotation direction; discharging a first chemical liquid to a first chemical liquid supplying position on the peripheral portion of the substrate by a first chemical liquid nozzle when the substrate holding unit is rotated in the first rotation direction, thereby performing a liquid processing for the peripheral portion of the substrate by the first chemical liquid while rotating the substrate held by the substrate holding unit in the first rotation direction; rotating the substrate holding unit in a second rotation direction which is opposite to the first rotation direction; and discharging a second chemical liquid to a second chemical liquid supplying position on the peripheral portion of the substrate by a second chemical liquid nozzle when the substrate holding unit is rotated in the second rotation direction, thereby performing the liquid processing for the peripheral portion of the substrate by the second chemical liquid while rotating the substrate held by the substrate holding unit in the second rotation direction.

According to the present disclosure, the first chemical liquid that is splashed to return or splashed from the substrate may be prevented from being adhered to the second chemical liquid nozzle, and in the same manner, the second chemical liquid that is splashed to return or splashed from the substrate may be prevented from being adhered to the first chemical liquid nozzle. Therefore, the first chemical liquid and the second chemical liquid may be prevented from being mixed with each other, thereby maintaining the atmosphere around the substrate to be clean.

Hereinafter, exemplary embodiments of the present disclosure will be described with reference to FIGS. 1 to 10. Herein, a substrate processing apparatus 1 that performs a liquid processing for a semiconductor wafer W which is a circular substrate ("a wafer") will be described.

A film made out of, for example, SiN is formed on wafer W to be processed by substrate processing apparatus 1 according to the present exemplary embodiment, and the film is formed to span the peripheral portion of wafer W at the bottom side through the lateral end of wafer W from the top surface of wafer W. Herein, substrate processing apparatus 1 is configured to remove a film disposed in the peripheral portion of wafer W among the films formed on wafer W, by supplying at least two types of different chemical liquids to wafer W. First, a substrate processing system 100 including substrate processing apparatus 1 will be described with reference to FIG. 1.

The top surface or the bottom surface of wafer W indicates a surface that faces upwardly or downwardly when wafer W is held horizontally by a substrate holding unit 21 as described below. Further, the peripheral portion of wafer W indicates an area on which a pattern of a semiconductor device is not formed, as an area which is around the lateral end of wafer W.

Substrate Processing System

FIG. 1 is a plan view illustrating a schematic configuration of a substrate processing system 100. As illustrated in FIG. 1, substrate processing system 100 includes a carrying-in/out station 10A configured to dispose a wafer carrier C that receives a plurality of wafers W and carry-in/out wafer W; and a processing station 10B configured to perform a liquid processing for wafer W. Carrying-in/out station 10A and processing station 10B are installed contiguously.

(Carrying-In/Out Station)

Carrying-in/out station 10A includes a carrier disposing unit 101, a transporting unit 102, a transferring unit 103, and a housing 104. Wafer carrier C that receives a plurality of wafers W in a horizontal state is disposed in carrier disposing unit 101. The transport of wafer W is performed in transporting unit 102, and the transfer of wafer W is performed in transferring unit 103. Transporting unit 102 and transferring unit 103 are accommodated in housing 104.

Transporting unit 102 includes a transporting mechanism 105. Transporting mechanism 105 includes a wafer holding arm 106 that holds wafer W, and a moving mechanism that moves wafer holding arm 106 forwardly and backwardly. Transporting mechanism 105 further includes: a moving mechanism that moves wafer holding arm 106 along a horizontal guide 107 extending in an X direction where wafer carrier C is arranged, a moving mechanism that moves wafer holding arm 106 along a vertical guide installed in a vertical direction, and a rotating mechanism that rotates wafer holding arm 106 within a horizontal surface, which are not illustrated. Transporting mechanism 105 transports wafer W between wafer carrier C and transferring unit 103.

Transferring unit 103 includes a transferring rack 200 including a plurality of disposing portions on which wafer W is placed. Transferring unit 103 is configured such that wafer W is exchanged between transferring unit 103 and processing station 10B through transferring rack 200.

(Processing Station)

Processing station 10B includes a housing 201; a plurality of substrate processing apparatuses 1 accommodated within housing 201; a transporting chamber 202; and a transporting mechanism 203 installed within transporting chamber 202. A mechanism that supplies liquid or gas to each of substrate processing apparatuses 1 may be accommodated below the plurality of substrate processing apparatuses 1.

Transporting mechanism 203 includes a wafer holding arm 204 that holds wafer W, and a moving mechanism that moves wafer holding arm 204 forwardly and backwardly. Transporting mechanism 203 further includes: a moving mechanism that moves wafer holding arm 204 in a Y direction along a horizontal guide 205 installed within transporting chamber 202, a moving mechanism that moves wafer holding arm 204 along a vertical guide installed in a vertical direction, and a rotating mechanism that rotates wafer holding arm 204 within a horizontal surface, which are not illustrated. Transporting mechanism 203 performs the carrying-in/out of wafer W with respect to each of substrate processing apparatuses 1.

Substrate Processing Apparatus

Next, substrate processing apparatus 1 will be described with reference to FIGS. 2 to 9.

Figure 2:
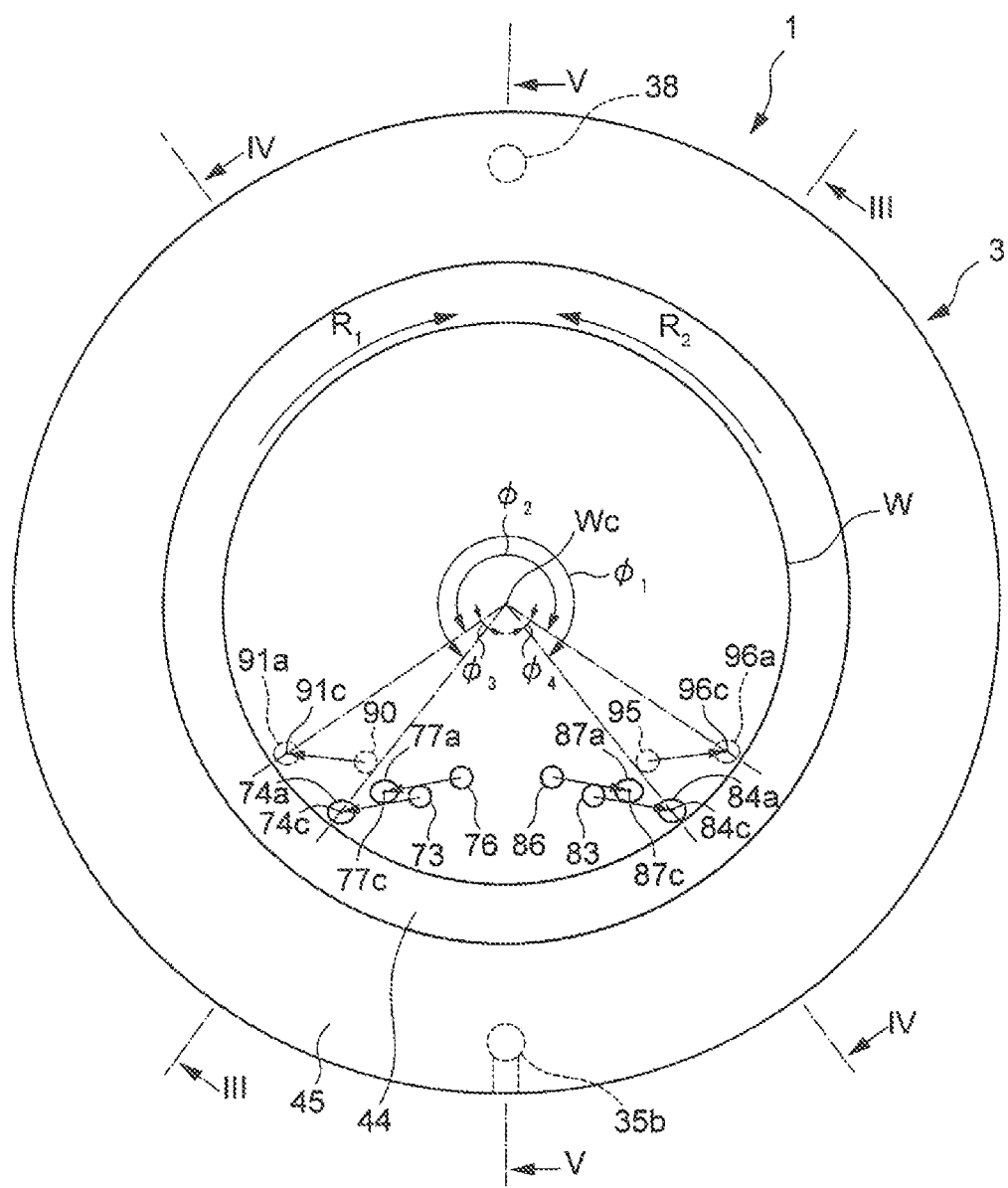
FIG. 2 is a plan view illustrating a schematic configuration of the substrate processing apparatus.

At first, a component that performs a liquid processing for the top surface of wafer W among the respective components of substrate processing apparatus 1 will be described. As illustrated in FIG. 2, substrate processing apparatus 1 includes a first chemical liquid nozzle 73 that discharges a first chemical liquid toward the top surface of wafer W, a second chemical liquid nozzle 83 that discharges a second chemical liquid toward the top surface of wafer W, and a first rinse nozzle 76 and a second rinse nozzle 86 that discharge a rinse liquid toward the top surface of wafer W and are installed in the vicinity of first chemical liquid nozzle 73 and second chemical liquid nozzle 83, respectively.

As illustrated in FIG. 2, substrate processing apparatus 1 further includes a cup body 3 which is configured to cover wafer W from the lateral side. Cup body 3 includes a cover portion 45 configured to receive the chemical liquid scattered from wafer W and a flange portion 44 configured to guide the chemical liquid scattered from wafer W toward a liquid receiving space (as described below) within cup body 3. In FIG. 2, a drain port 38 configured to discharge the chemical liquid to outside and formed in the liquid receiving space (as described below) within cup body 3 and a carrier liquid supplying port 35b configured to supply a carrier liquid that prompts flow of a liquid into the liquid receiving space, are illustrated as a dot line, respectively.

The chemical liquids that are different from each other are used as the first chemical liquid and the second chemical liquid. For example, an alkali chemical liquid such as, for example, a mixed solution of ammonia, hydrogen peroxide and de-ionized water (SC-1 solution) is used as the first chemical liquid, and an acid chemical liquid such as, for example, a mixed solution of hydrofluoric acid and de-ionized water (HF solution) is used as the second chemical liquid. A liquid capable of washing out the chemical liquid that remains on wafer W is used as a rinse liquid, and for example, de-ionized water (DIW) is used.

However, it is considered that foreign substances or gases are generated caused by a chemical reaction when the different types of chemical liquids are mixed with each other. For example, it is considered that, when an alkali chemical liquid and an acid chemical liquid are mixed with each other, a salt is generated by the chemical reaction, and thus, wafer W or the atmosphere within substrate processing apparatus 1 is contaminated by the salt. In the present exemplary embodiment, first chemical liquid nozzle 73 and second chemical liquid nozzle 83, as described above, are configured such that the different types of the chemical liquids are prevented from being mixed with each other. Hereinafter, the schematic configuration of each of chemical liquid nozzles 73, 83 will be described.

At first, the reaching point and the direction of a liquid discharged from each of chemical liquid nozzle 73, 83 and each of rinse nozzles 76, 86 will be described. In FIG. 2, an area where the first chemical liquid discharged from first chemical liquid nozzle 73 disposed in a first processing position as described below is spread when the liquid reaches the top surface of wafer W ("a first chemical liquid supplying position") is indicated as a solid line with a reference numeral 74a, and an area where the rinse liquid discharged from first rinse nozzle 76 is spread when the liquid reaches the top surface of wafer W ("a first rinse liquid supplying position") is indicated as a solid line with a reference numeral 77a. Similarly, an area where the second chemical liquid discharged from second chemical liquid nozzle 83 disposed in a second processing position as described below is spread when the liquid reaches the top surface of wafer W ("a second chemical liquid supplying position") is indicated as a solid line with a reference numeral 84a, and an area where the rinse liquid discharged from second rinse nozzle 86 is spread when the liquid reaches the top surface of wafer W ("a second rinse liquid supplying position") is indicated as a solid line with a reference numeral 87a.

In the present exemplary embodiment, the central angle $\phi_1$ formed between the chemical liquid nozzles, which is formed by connecting the central point $W_c$ of wafer W, a central point 74c of first chemical liquid supplying position 74a as described above and a central point 84c of second chemical liquid supplying position 84a, becomes more than 180 degrees when central angle $\phi_1$ between the chemical liquid nozzles is viewed along a first rotation direction $R_1$ as illustrated in FIG. 2 with respect to first chemical liquid supplying position 74a as a reference. Central angle $\phi_1$ between the chemical liquid nozzles may become equal to or more than 240 degrees, and for example, in the example illustrated in FIG. 2, central angle $\phi_1$ between the chemical liquid nozzles may become about 300 degrees. First chemical liquid nozzle 73 and second chemical liquid nozzle 83 are configured such that the conditions regarding central angle $\phi_1$ between the chemical liquid nozzles are satisfied, and thus, the chemical liquid discharged from one of the chemical liquid nozzles may be prevented from being adhered to the other of the chemical liquid nozzles, as described below. Accordingly, different types of chemical liquids may be prevented from being mixed with each other.

As described below, the liquids from first chemical liquid nozzle 73 and first rinse nozzle 76 are discharged while wafer W is being rotated in first rotation direction $R_1$. Further, the liquids from second chemical liquid nozzle 83 and second rinse nozzle 86 are discharged while wafer W is being rotated in second rotation direction $R_2$. Herein, first chemical liquid nozzle 73 and first rinse nozzle 76 may be configured such that the discharging directions of the first chemical liquid and the first rinse liquid are inclined in first rotation direction $R_1$. Herein, the expression the discharging direction is inclined in first rotation direction $R_1$ indicates that the vectors indicating the discharging directions of the first chemical liquid and the first rinse liquid (arrows out of first chemical liquid nozzle 73 and first rinse nozzle 76 in FIG. 2) have a component of first rotation direction $R_1$ of wafer W, respectively. Similarly, second chemical liquid nozzle 83 and second rinse nozzle 86 may be configured such that the discharging directions of the second chemical liquid and the second rinse liquid are inclined in second rotation direction $R_2$. In this way, the discharging direction of a liquid such as a chemical liquid or a rinse liquid has the same component as the rotation direction of wafer W, and thus, the difference between the speed of the liquid that reaches the top surface of wafer W and the rotation speed of wafer W may be decreased. As a result, the collision energy generated when the liquid discharged from each of nozzles 73, 76, 83, 86 reaches the top surface of wafer W may be decreased. Therefore, the splashing of the liquid discharged to wafer W or remains on the top surface of wafer W may be prevented, thereby preventing the different types of chemical liquids from being mixed with each other in each of nozzles 73, 76, 83, 86. Further, it is prevented that the liquid is splashed to return, and thus, most of the discharged liquid may be used effectively for the processing of wafer W without wasting the discharged liquid.

As illustrated in FIG. 2, first rinse nozzle 76 may be disposed at the upstream side of first chemical liquid nozzle 73 with respect to first rotation direction $R_1$. Therefore, the first chemical liquid discharged from first chemical liquid nozzle 73 may be prevented from being adhered to first rinse nozzle 76. Similarly, second rinse nozzle 86 is disposed at the upstream side of second chemical liquid nozzle 83 with respect to second rotation direction $R_2$. Therefore, the second chemical liquid discharged from second chemical liquid nozzle 83 may be prevented from being adhered to second rinse nozzle 86. First rinse nozzle 76 and second rinse nozzle 86 are disposed as described above, and thus, first chemical liquid and the second chemical liquid may be surely prevented from being mixed with each other on rinse nozzles 76, 86.

Further, first rinse liquid supplying position 77a may be disposed to a position near the center of wafer W compared to first chemical liquid supplying position 74a. That is, the rinse liquid is supplied to a position near the center of wafer W compared to the first chemical liquid. Therefore, an area on which the first chemical liquid flows of the top surface of wafer W may be surely cleaned by the rinse liquid. Similarly, second rinse liquid supplying position 87a may be disposed to a position near the center of wafer W compared to second chemical liquid supplying position 84a.

Next, a component that performs a liquid processing for the bottom surface of wafer W among the respective components of substrate processing apparatus 1 will be described. As illustrated in FIG. 2, substrate processing apparatus 1 further includes a first chemical liquid discharging port 90 that discharges the first chemical liquid toward the bottom surface of wafer W, and a second chemical liquid discharging port 95 that discharges the second chemical liquid toward the bottom surface of wafer W. As for the first chemical liquid and the second chemical liquid discharged from first chemical liquid discharging port 90 and second chemical liquid discharging port 95, respectively, the same chemical liquid is used as the first chemical liquid and the second chemical liquid discharged from first chemical liquid nozzle 73 and second chemical liquid nozzle 83, respectively, as described above. Meanwhile, as described below, a discharging port such as, for example, a rinse liquid discharging port that discharges a rinse liquid toward the bottom surface of wafer W may be further included in substrate processing apparatus 1.

Next, the reaching point and the direction of a liquid discharged from each of chemical liquid discharging ports 90, 95 will be described. In FIG. 2, an area on the bottom surface of wafer W in which the first chemical liquid discharged from first chemical liquid discharging port 90 reaches ("a third chemical liquid supplying position") is indicated as a dot line with a reference numeral 91a, and an area on the bottom surface of wafer W in which the second chemical liquid discharged from second chemical liquid discharging port 95 reaches ("a fourth chemical liquid supplying position") is indicated as a dot line with a reference numeral 96a.

Herein, a central angle $\phi_2$ between the chemical liquid discharging ports, which is formed by connecting a central point $W_c$ of wafer W, a central point 91c of third chemical liquid supplying position 91a as described above and a central point 96c of fourth chemical liquid supplying position 96a, becomes more than 180 degrees when central angle $\phi_2$ between the chemical liquid discharging ports is viewed along first rotation direction $R_1$ as illustrated in FIG. 2 with respect to third chemical liquid supplying position 91a as a reference. Central angle $\phi_2$ between the chemical liquid discharging ports may become equal to or more than 240 degrees, and for example, in the example illustrated in FIG. 2, central angle $\phi_2$ between the chemical liquid discharging ports may become about 260 degrees. First chemical liquid discharging port 90 and second chemical liquid discharging port 95 are configured such that the conditions regarding central angle $\phi_2$ between the chemical liquid discharging ports are satisfied, and thus, a chemical liquid discharged from one of the chemical liquid discharging ports may be prevented from being adhered to the other of the chemical liquid discharging ports, as described below. Accordingly, the different types of chemical liquids may be prevented from being mixed with each other.

As described below, the first chemical liquid from first chemical liquid discharging port 90 is discharged together with the first chemical liquid from first chemical liquid nozzle 73, concurrently, while wafer W is rotated in first rotation direction $R_1$. Further, the second chemical liquid from second chemical liquid discharging port 95 is discharged together with the second chemical liquid from second chemical liquid nozzle 83, concurrently, while wafer W is rotated in second rotation direction $R_2$. Herein, first chemical liquid discharging port 90 may be configured such that the discharging direction of the first chemical liquid is inclined in first rotation direction $R_1$. Similarly, second chemical liquid discharging port 95 may be configured such that the discharging direction of the second chemical liquid is inclined in second rotation direction $R_2$. As a result, as in chemical liquid nozzles 73, 83 as described above, a collision energy generated when the chemical liquid discharged from each of chemical liquid discharging ports 90, 95 reaches the bottom surface of wafer W may be decreased. As a result, the liquid that reaches the bottom surface of wafer W may be prevented from being scattered.

However, the liquid that reaches the bottom surface of wafer W from each of chemical liquid discharging ports 90, 95 may wind to enter the top surface side of wafer W while wafer W is being rotated. In this case, if a chemical liquid is discharged from chemical liquid nozzles 73, 83 disposed above wafer W toward the area where the chemical liquid entered to the top surface of wafer W exists, the chemical liquid discharged from chemical liquid discharging ports 90, 95 and the chemical liquid discharged from chemical liquid nozzles 73, 83 may collide with each other to generate mist. According to the present exemplary embodiment, herein, first chemical liquid discharging port 90 is configured such that third chemical liquid supplying position 91a is disposed in the downstream side of first chemical liquid supplying position 74a on the top surface of wafer W with respect to first rotation direction $R_1$, as illustrated in FIG. 2. As a result, when viewed along first rotation direction $R_1$, the distance from third chemical liquid supplying position 91a to first chemical liquid supplying position 74a becomes long. Therefore, the first chemical liquid that is discharged from first chemical liquid discharging port 90 and reaches the bottom surface of wafer W is scattered from wafer W by the centrifugal force using the rotation of wafer W before the liquid is conveyed to first chemical liquid supplying position 74a. Accordingly, the first chemical liquid discharged from first chemical liquid discharging port 90 may be prevented from existing within first chemical liquid supplying position 74a. As a result, the first chemical liquid supplied from first chemical liquid discharging port 90 and the first chemical liquid supplied from first chemical liquid nozzle 73 may be prevented from colliding with each other, and thus, the mist of the first chemical liquid may be prevented from being generated. Similarly, second chemical liquid discharging port 95 is configured such that fourth chemical liquid supplying position 96a is disposed in the downstream side of second chemical liquid supplying position 84a on the top surface of wafer W with respect to second rotation direction $R_2$. As a result, the second chemical liquid supplied from second chemical liquid discharging port 95 and the second chemical liquid supplied from second chemical liquid nozzle 83 may be prevented from colliding with each other, and thus, the mist of the second chemical liquid may be prevented from being generated.

The detailed arrangement of first chemical liquid discharging port 90 is not limited specifically, but first chemical liquid discharging port 90 may be configured such that a central angle $\phi_3$ formed by connecting central point $W_C$ of wafer W, a central point 91c of third chemical liquid supplying position 91a, and central point 74c of first chemical liquid supplying position 74a becomes equal to or more than 10 degrees. Similarly, second chemical liquid discharging port 95 may be configured such that a central angle $\phi_4$ formed by connecting central point $W_C$ of wafer W, a central point 96c of fourth chemical liquid supplying position 96a, and central point 84c of second chemical liquid supplying position 84a becomes equal to or more than 10 degrees.

Figure 3:
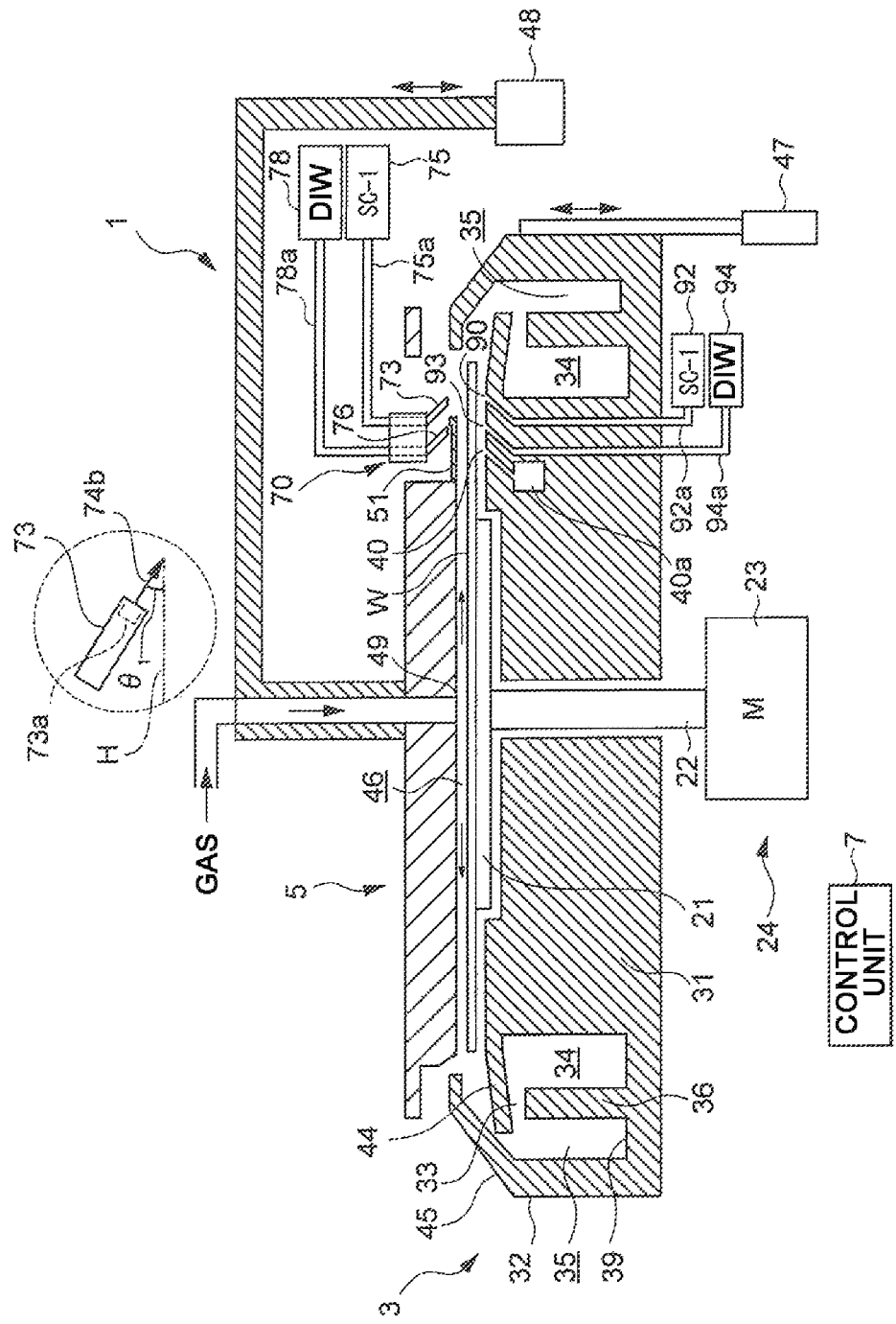
FIG. 3 is a vertical cross-sectional view of the substrate processing apparatus illustrated in FIG. 2 when viewed from the direction of III-III.
Figure 4:
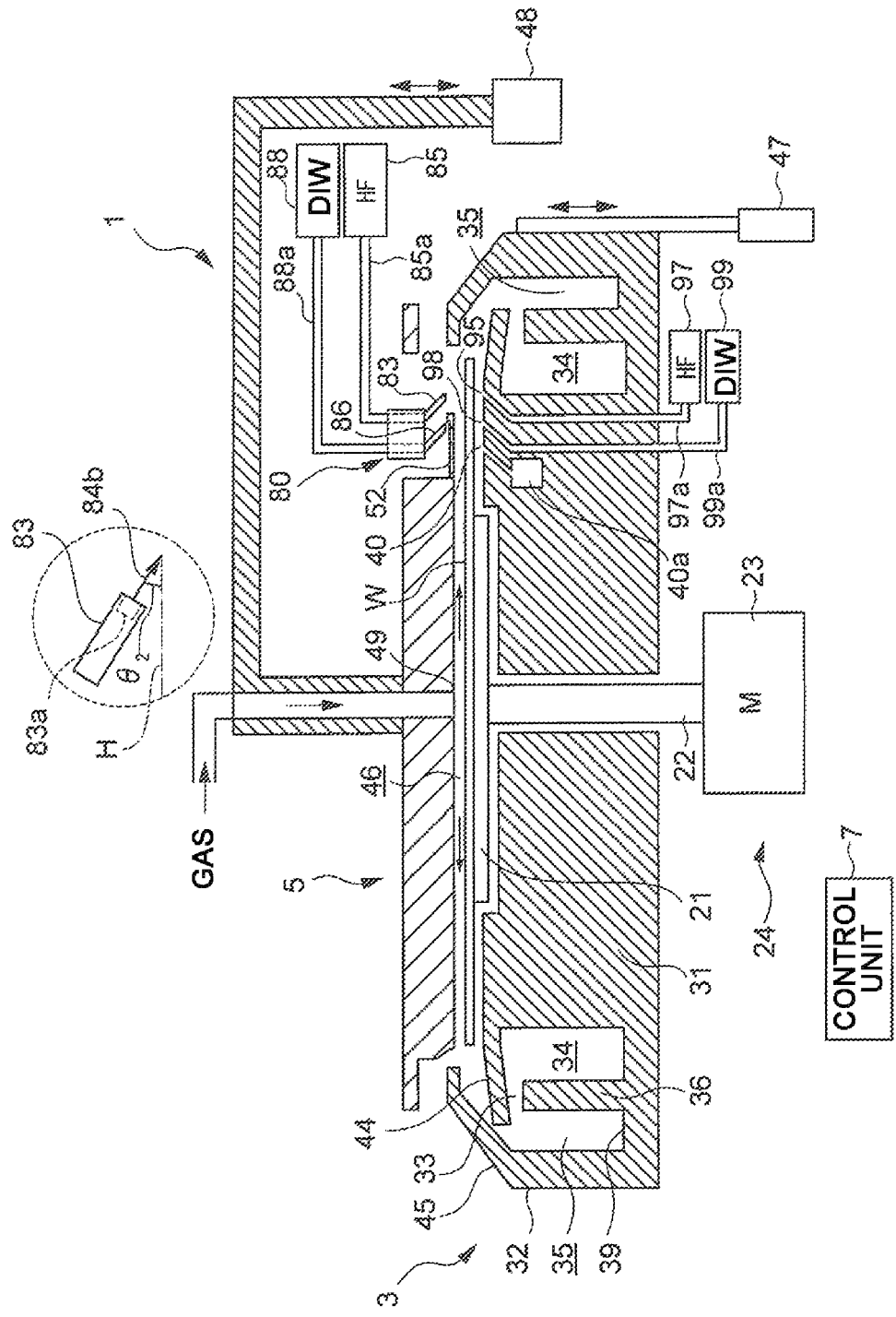
FIG. 4 is a vertical cross-sectional view of the substrate processing apparatus illustrated in FIG. 2 when viewed from the direction of IV-IV.
Figure 5:
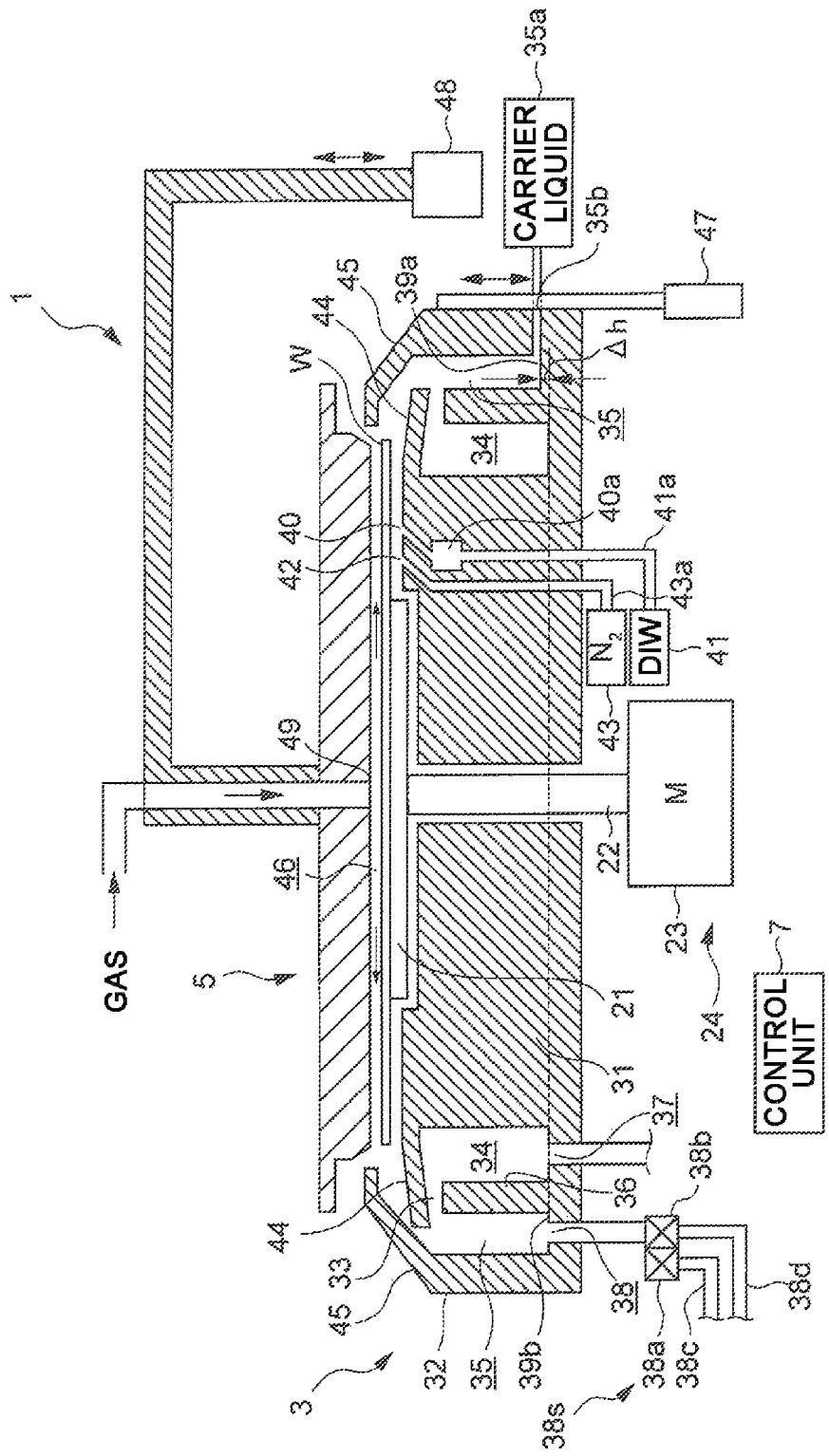
FIG. 5 is a vertical cross-sectional view of the substrate processing apparatus illustrated in FIG. 2 when viewed from the direction of V-V.

The detailed structure of substrate processing apparatus 1 in order to make the discharging of the chemical liquid and the rinse liquid satisfying the reaching point or the direction as described above to be possible will be described below with reference to FIGS. 3 to 5. FIG. 3 is a vertical cross-sectional view of substrate processing apparatus illustrated in FIG. 2 when viewed from III-III direction, FIG. 4 is a vertical cross-sectional view of substrate processing apparatus illustrated in FIG. 2 when viewed from IV-IV direction, and FIG. 5 is a vertical cross-sectional view of substrate processing apparatus illustrated in FIG. 2 when viewed from V-V direction. Meanwhile, in FIG. 3, for ease of description, all of first chemical liquid nozzle 73, first rinse nozzle 76 and first chemical liquid discharging port 90 are illustrated in the vertical cross-sectional view of substrate processing apparatus 1 when viewed from III-III direction. Similarly, in FIG. 4, for the convenience of description, all of second chemical liquid nozzle 83, second rinse nozzle 86 and second chemical liquid discharging port 95 are illustrated in the vertical cross-sectional view of substrate processing apparatus 1 when viewed from IV-IV direction.

As illustrated in FIGS. 3 to 5, substrate processing apparatus 1 includes: a substrate holding unit 21 that holds wafer W horizontally; a rotation driving unit 24 that is connected to the bottom side of substrate holding unit 21 and rotates substrate holding unit 21; a cup body 3 installed to cover wafer W from lateral side; and a cover member 5 installed to face the top surface of wafer W through a space therebetween. Hereinafter, each of components will be sequentially described.

(Substrate Holding Unit and Rotation Driving Unit)

Substrate holding unit 21 is configured to hold wafer W horizontally without contacting the peripheral portion of wafer W, and, for example, configured as a vacuum chuck that adsorbs and holds the central portion of the bottom surface of wafer W. Rotation driving unit 24 includes a rotation driving shaft 22 that supports substrate holding unit 21 and a motor 23 that rotates rotation driving shaft 22. By rotating rotation driving shaft 22, wafer W held by substrate holding unit 21 may be rotated around a vertical direction axis. Meanwhile, rotation driving shaft 22 of rotation driving unit 24 may be configured to be rotated in either one of first rotation direction $R_1$ or second rotation direction $R_2$ that is opposite to first rotation direction $R_1$.

(Cup Body)

Cup body 3 is a ring shaped member, and is configured to surround the lateral ends of substrate holding unit 21 and wafer W from the lateral side and to include an opening 46 in which wafer W may be inserted therethrough. The inner structure of cup body 3 will be described first. As illustrated in FIGS. 3 to 5, the inside of cup body 3 is provided with a recess portion 33 opened upwardly and extends along a circumference direction. Recess portion 33 includes: a ring shaped exhaust space 34 which is a flow path to exhaust gas generated during the liquid processing or entered by being conveyed to the vicinity of wafer W to the outside; an exhaust port 37 communicated with exhaust space 34; a ring shaped liquid receiving space 35 which is a flow path to receive a liquid such as, for example, the chemical liquid or rinse liquid scattered from wafer W during the liquid processing and discharge the received liquid to the outside; and a drain port 38 communicated with ring shaped liquid receiving space 35. Exhaust space 34 and liquid receiving space 35 are partitioned by a wall 36 formed in recess portion 33. Wall 36 is configured such that the liquid component dispersed within a gas current is separated from the gas current in liquid receiving space 35. Moreover, as illustrated in FIGS. 2 and 5, cup body 3 is provided with a carrier liquid supplying port 35b that supplies a carrier liquid promoting the flow of liquid toward drain port 38 to liquid receiving space 35.

The gas input to exhaust space 34 is exhausted to the outside via exhaust port 37. The liquid received by liquid receiving space 35 is discharged off to the outside from drain port 38 using a drain mechanism 38s. Exhaust port 37 and drain port 38 are disposed in the same side of cup body 3 such that exhaust port 37 and drain port 38 are close to each other, as illustrated in FIG. 5. Meanwhile, exhaust port 37 and drain port 38 may be disposed in different sides. Drain mechanism 38s may be configured such that the liquids are discharged through different paths according to the type of liquids to be drained. For example, as illustrated in FIG. 5, drain mechanism 38s may include a first switch valve 38a, a first drain pipe 38c connected to first switch valve 38a, a second switch valve 38b, and a second drain pipe 38d connected to second switch valve 38b. In this case, different liquids may be discharged through different paths by opening one of switch valves 38a, 38b according to the type of liquid that remains within liquid receiving space 35. For example, first switch valve 38a is opened to discharge the first chemical liquid to first drain pipe 38c when the first chemical liquid is discharged, and second switch valve 38b is opened to discharge the second chemical liquid to second drain pipe 38d when the second chemical liquid is discharged. In order to divide the discharging paths more finely according to the type of liquids, three or more of switch valves and drain pipes may be provided.

Next, the external appearance of cup body 3 will be described. Herein, a portion disposed in an inner side than recess portion 33 of cup body 3 is defined as an inner peripheral portion 31, and a portion disposed in an outer side than recess portion 33 of cup body 3 is defined as an outer peripheral portion 32. As illustrated in FIGS. 3 to 5, cup body 3 includes a flange portion 44 that extends toward the outside from the top end of inner peripheral portion 31, and a cover portion 45 that extends from the top end of outer peripheral portion 32 toward the inner side and to a position above flange portion 44. Among them, flange portion 44 is configured to guide the liquid scattered from wafer W or the gas current around wafer W into the inside of cup body 3. Cover portion 45 is configured to receive the liquid scattered from wafer W, which is rotated, in the inner surface of cover portion 45 and guide the received liquid into the inside of cup body 3.

Further, cup body 3 is provided with an elevating mechanism 47 that elevates cup body 3.

(Cover Member)

Cover member 5 is configured to cover opening 46 of cup body 3 from above during the liquid processing, and is configured as, for example, a circular plate shape. Cover member 5 is provided with an elevating mechanism 48 that elevates cover member 5. Therefore, cover member 5 may adjoin to cup body 3 or may move away from cup body 3. In FIGS. 3 to 5, the position of cover member 5 during the liquid processing of wafer W is illustrated.

Next, the structure of the nozzle and discharging port that discharge liquid or gas with respect to wafer W will be described.

At first, a component such as, for example, chemical liquid nozzles 73, 83 and rinse nozzles 76, 86, which are described above and are configured to perform a processing for wafer W from above, will be described. As illustrated in FIG. 3, first chemical liquid nozzle 73 and first rinse nozzle 76 are supported by a first nozzle driving unit 70, together. First nozzle driving unit 70 may move first chemical liquid nozzle 73 and first rinse nozzle 76 in a single body. A first chemical liquid supplying unit 75 that supplies a first chemical liquid such as, for example, SC-1 solution to first chemical liquid nozzle 73 is connected to first chemical liquid nozzle 73 via a supplying pipe 75a, and a rinse liquid supplying unit 78 that supplies a rinse liquid such as, for example, DIW to first rinse nozzle 76 is connected to first rinse nozzle 76 via a supplying pipe 78a. Similarly, as illustrated in FIG. 4, second chemical liquid nozzle 83 and second rinse nozzle 86 are supported by a second nozzle driving unit 80, together. Second nozzle driving unit 80 may move second chemical liquid nozzle 83 and second rinse nozzle 86 in a single body. A second chemical liquid supplying unit 85 that supplies a second chemical liquid such as, for example, HF solution to second chemical liquid nozzle 83 is connected to second chemical liquid nozzle 83 via a supplying pipe 85a, and a rinse liquid supplying unit 88 that supplies a rinse liquid such as, for example, DIW to second rinse nozzle 86 is connected to second rinse nozzle 86 via a supplying pipe 88a. Each of nozzle driving units 70, 80 is mounted on the cover member 5, as described above.

(Nozzle Driving Unit)

Figure 6:
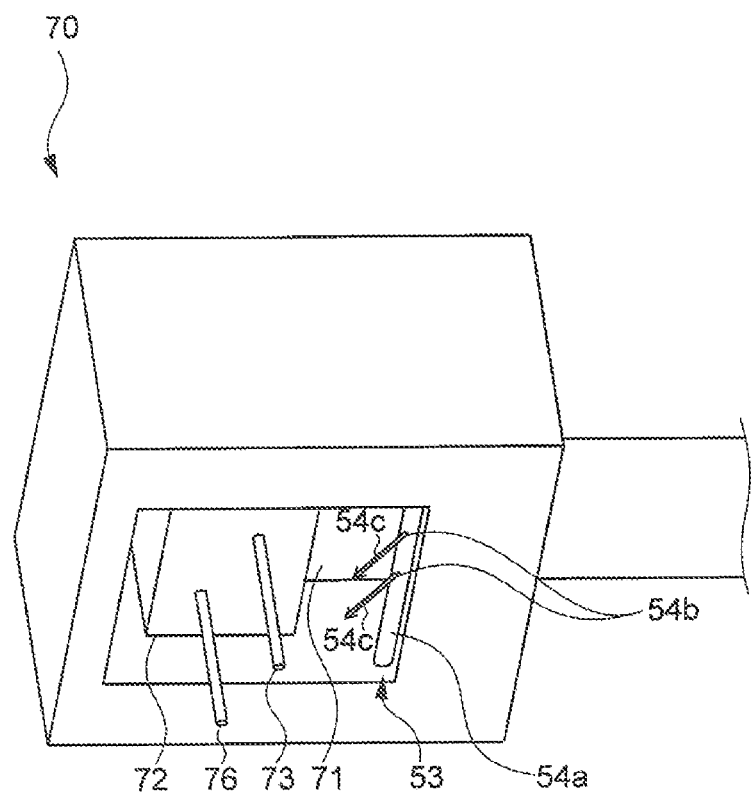
FIG. 6 is a view illustrating a chemical liquid nozzle and a rinse nozzle which are supported by a nozzle driving unit when viewed obliquely from the lower side.

Nozzle driving units 70, 80 are described in detail with reference to FIG. 6. FIG. 6 is a view illustrating first chemical liquid nozzle 73 and first rinse nozzle 76 which are supported by first nozzle driving unit 70 when viewed from below obliquely.

As illustrated in FIG. 6, first nozzle driving unit 70 includes: a first nozzle head 72 that supports first chemical liquid nozzle 73 and first rinse nozzle 76; and a head support shaft 71 connected to first nozzle head 72 and configured to move in a direction of an axis thereof. Similarly, even though it is not illustrated, second nozzle driving unit 80 includes: a second nozzle head that supports second chemical liquid nozzle 83 and second rinse nozzle 86; and a head support shaft connected to the second nozzle head and configured to move in a direction of an axis thereof. The head support shaft of each of nozzle driving units 70, 80 is arranged such that the axis direction thereof is roughly parallel to a radial direction of wafer W. Using the nozzle driving units 70, 80, each of chemical liquid nozzles 73, 83 and rinse nozzles 76, 86 may be disposed in a desired position above wafer W according to circumstances.

Hereinafter, the position in the radial direction of wafer W to which each of chemical liquid nozzles 73, 83 and rinse nozzles 76, 86 may take will be described with reference to FIGS. 7A to 7D. Meanwhile, since the radial direction positions to which first chemical liquid nozzle 73 and first rinse nozzle 76 may take are approximately the same as the radial direction positions to which second chemical liquid nozzle 83 and second rinse nozzle 86 may take, and thus, the present description will be performed only for first chemical liquid nozzle 73 and first rinse nozzle 83. In FIGS. 7A to 7D, the liquid currents of the first chemical liquid and the rinse liquid discharged from first chemical liquid nozzle 73 and first rinse nozzle 83 are indicated as reference numerals 74b, 77b, respectively.

Figure 7A:
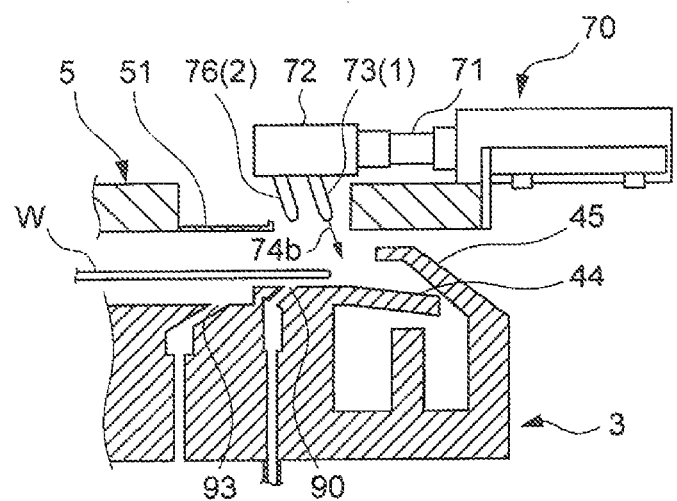
FIG. 7A is a view illustrating the chemical liquid nozzle disposed in a outside position.

FIG. 7A illustrates first chemical liquid nozzle 73 disposed in a position, which is a position outer than a first processing position as described below, where the first chemical liquid discharged from first chemical liquid nozzle 73 does not reach wafer W ("a first out-side position"). Meanwhile, in FIG. 7 and the following figures, first chemical liquid nozzle 73 disposed in the first out-side position is indicated as a reference numeral 73(1). Similarly, with respect to other components, a reference numeral in parentheses (1) attached to the rear thereof indicates that the component is disposed in the out-side position.

In the first out-side position, so called a dummy dispense to stabilize, for example, liquid current 74b may be performed before the first chemical liquid is discharged toward the peripheral portion of wafer W. In FIG. 7A, a state is illustrated where liquid current 74b discharged from first chemical liquid nozzle 73 disposed in the first out-side position proceeds to a position outer than the peripheral portion of wafer W.

Figure 7B:
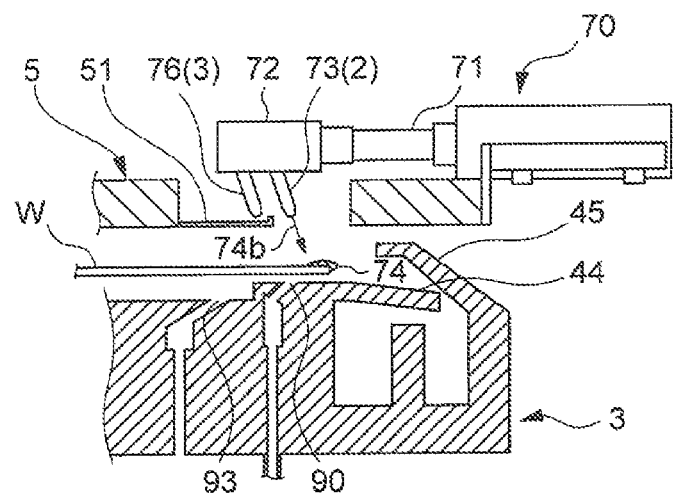
FIG. 7B is a view illustrating the chemical liquid nozzle disposed in a processing position.

FIG. 7B illustrates a position where first chemical liquid nozzle 73 is disposed to discharge the first chemical liquid toward the peripheral portion of wafer W ("a first processing position"). Further, in FIG. 7B and the following figures, first chemical liquid nozzle 73 disposed in the first processing position is indicated as a reference numeral 73(2). Similarly, with respect to other components, a reference numeral in parentheses (2) attached to the rear thereof indicates that the component is disposed in the processing position. When chemical liquid nozzle 73 is disposed in the first processing position, the liquid current 74b of the first chemical liquid discharged from chemical liquid nozzle 73 reaches the peripheral portion of wafer W. The first chemical liquid that reaches the peripheral portion of wafer W, as indicated as reference numeral 74 in FIG. 7B, spreads toward the peripheral portion side on the top surface of wafer W by the centrifugal force generated by the rotation of wafer W.

Figure 7C:
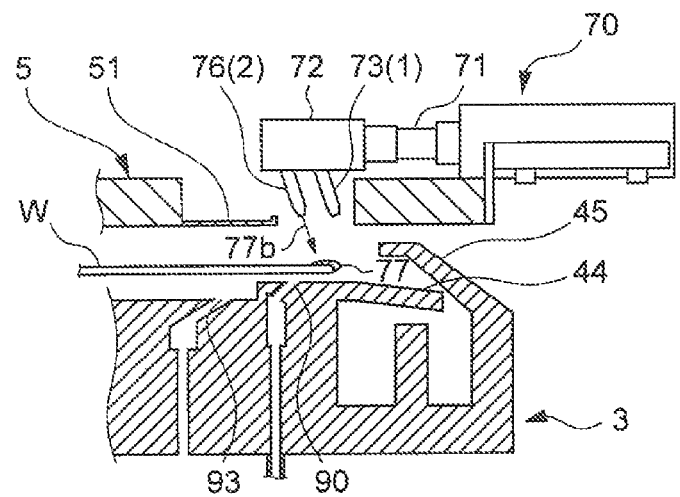
FIG. 7C is a view illustrating the rinse nozzle disposed in a rinse processing position.

FIG. 7C illustrates a position where first rinse nozzle 76 is disposed to discharge the rinse liquid toward the peripheral portion of wafer W ("a rinse processing position"). When first rinse nozzle 76 is disposed in the rinse processing position, the rinse liquid discharged from first rinse nozzle 76 reaches the peripheral portion of wafer W. At that time, the supplying position of the rinse liquid on wafer W is close to the center of wafer W as compared to the supplying position of the first chemical liquid that is discharged from chemical liquid nozzle 73 and reaches the surface of wafer W. The first rinse liquid that reaches the surface of wafer W, as indicated as reference numeral 77 in FIG. 7C, spreads toward the peripheral portion side on the top surface of wafer W by the centrifugal force generated by the rotation of wafer W.

Figure 7D:
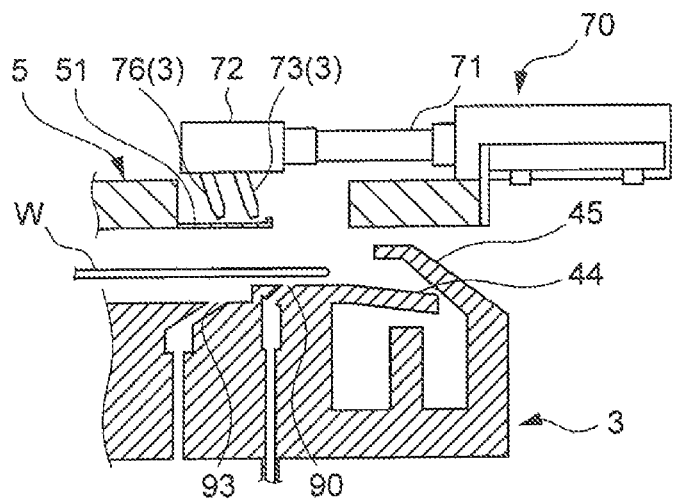
FIG. 7D is a view illustrating the chemical liquid nozzle disposed in a stand-by position.

FIG. 7D illustrates a position where first chemical liquid nozzle 73 may be disposed while the first chemical liquid is not discharged ("a first stand-by position"). Meanwhile, in FIG. 7D and the following figures, first chemical liquid nozzle 73 disposed in the first stand-by position is indicated as a reference numeral 73(3). Similarly, with respect to other components, a reference numeral in parentheses (3) attached to the rear thereof means that the component is disposed in the stand-by position. In the present exemplary embodiment, first chemical liquid nozzle 73 and first rinse nozzle 76 are configured such that they move integrally. When first chemical liquid nozzle 73 is disposed in the first stand-by position, first rinse nozzle 76 is also disposed in the stand-by position.

As illustrated in FIG. 7D, the stand-by position of first chemical liquid nozzle 73 is disposed to be close to the center side of wafer W as compared to the first out-side position and the first processing position of first chemical liquid nozzle 73 and the rinse processing position of first rinse nozzle 76, as described above. The stand-by position of first rinse nozzle 76 is disposed to be close to the center side of wafer W as compared to the first out-side position and the first processing position of first chemical liquid nozzle 73 and the rinse processing position of first rinse nozzle 76. The stand-by positions of first chemical liquid nozzle 73 and first rinse nozzle 76 are positions where first chemical liquid nozzle 73 and first rinse nozzle 76 are retracted to prevent the chemical from a different nozzle such as, for example, second chemical liquid nozzle 83 from being adhered to first chemical liquid nozzle 73 and first rinse nozzle 76, while a liquid processing by the different nozzle is performed.

First chemical liquid nozzle 73 and first rinse nozzle 76 move by first nozzle driving unit 70 according to the circumstances, and thus, as described below, the liquid processing using first chemical liquid nozzle 73 and first rinse nozzle 76 may be effectively performed while preventing the contamination of first chemical liquid nozzle 73 and first rinse nozzle 76.

As illustrated in FIG. 7A, first rinse nozzle 76 is disposed to be close to the center side of wafer W compared to first chemical liquid nozzle 73. That is, as illustrated in FIG. 7C, first chemical liquid nozzle 73 and first rinse nozzle 76 are adhered to first nozzle head 72 such that, when first chemical liquid nozzle 73 is disposed in the first out-side position by first nozzle driving unit 70, first rinse nozzle 76 is disposed in the processing position thereof (a rinse processing position) at the same time. Therefore, as described below, after the liquid processing by the first chemical liquid discharged from first chemical liquid nozzle 73 is completed, and right then, the rinse liquid may be supplied to the peripheral portion of wafer W. First rinse nozzle 76 is disposed in the center side, and thus, first rinse nozzle 76 may be prevented from being contaminated by the first chemical liquid discharged from first chemical liquid nozzle 73. Meanwhile, the effect in which first rinse nozzle 76 is prevented from being contaminated is further increased by generating a gas flow that proceeds from the center side of wafer W to the outside caused by a gas discharged from a gas supplying port 49 as described below. Even though it is not illustrated, second rinse nozzle 86 is also disposed in the center side of wafer W compared to second chemical liquid nozzle 83 such that, when second chemical liquid nozzle 83 is disposed in the out-side position, the liquid current of the rinse liquid discharged from second rinse nozzle 86 reaches the peripheral portion of wafer W.

As illustrated in FIG. 7D, a first liquid receiving portion 51 that receives the first chemical liquid dropped from first chemical liquid nozzle 73 is provided between first chemical liquid nozzle 73 disposed in the first stand-by position and wafer W. When first liquid receiving portion 51 is provided, wafer W may be prevented from being contaminated by the first chemical liquid dropped from first chemical liquid nozzle 73 disposed in the first stand-by position. The concrete configuration of first liquid receiving portion 51 is not limited especially, but, for example, first liquid receiving portion 51 is configured as a member including an edge portion fixed to cover member 5 and configured to prevent the overflow of the liquid. As illustrated in FIG. 4, a second liquid receiving portion 52 which is the same as first liquid receiving portion 51 may be provided to receive the second chemical liquid dropped from second chemical liquid nozzle 83 disposed in the stand-by position.

As illustrated in FIG. 6, a first chemical liquid nozzle-cleaning mechanism 53 including a cleaning liquid supplying pipe 54a with a cleaning liquid discharging port 54b that discharges a cleaning liquid toward first chemical liquid nozzle 73, may be provided in the vicinity of first chemical liquid nozzle 73. Further, a cleaning liquid discharging port 54b that discharges a cleaning liquid toward first rinse nozzle 76 may be further provided in cleaning liquid supplying pipe 54a of first chemical liquid nozzle-cleaning mechanism 53. When first chemical liquid nozzle-cleaning mechanism 53 is provided, for example, the liquid adhered to first chemical liquid nozzle 73 or first rinse nozzle 76 may be washed. First chemical liquid nozzle-cleaning mechanism 53 is provided in first nozzle driving mechanism 70. As a cleaning liquid, for example, DIW is used. Even though it is not illustrated, a second chemical liquid nozzle-cleaning mechanism including a cleaning liquid discharging port that discharges a cleaning liquid toward second chemical liquid nozzle 83 may be provided in the vicinity of second chemical liquid nozzle 83. The configuration of the second chemical liquid nozzle-cleaning mechanism is the same as first chemical liquid nozzle-cleaning mechanism 53 as described above, and thus, the detailed description thereof will be omitted.

As illustrated in FIGS. 3 and 4, each of nozzles 73, 76, 83, 86 is configured such that each of the discharging directions of the chemical liquid and rinse liquid discharged has a component toward the radial direction outside of wafer W. Specifically, as chemical liquid nozzles 73, 83 are enlargely illustrated with a portion surrounded by a dot circle in FIGS. 3 and 4, respective chemical liquid nozzle 73, 83 are configured such that angles $\theta_1$, $\theta_2$ formed between a horizontal surface H and liquid currents 74b, 84b of the first chemical liquid and the second chemical liquid discharged from discharging ports 73a, 83a of respective chemical liquid nozzles 73, 83 are less than 90 degrees, respectively. Therefore, the chemical liquids that are discharged from chemical liquid nozzles 73, 83 to reach wafer W may be quickly scattered toward the radial direction outside of wafer W. As a result, the atmosphere in the vicinity of wafer W may be maintained more cleanly. As illustrated in FIGS. 3 and 4, rinse nozzles 76, 86 are also formed in the same way.

As illustrated in FIGS. 3 to 5, substrate processing apparatus 1 may include a gas supplying port 49 formed in cover member 5 at the center side of wafer W compared to first chemical liquid nozzle 73 and second chemical liquid nozzle 83 and configured to discharge a clean gas toward the top surface of wafer W. A dry air or an inert gas such as, for example, a nitride may be used as the gas. When gas supplying port 49 is formed, the gas current that proceeds from the center side of wafer W to the outside in the vicinity of wafer W, as indicated by an arrow in the space between cover member 5 and wafer W. As a result, even though the mist of the chemical liquid is generated in the vicinity of wafer W during the liquid processing by the chemical liquid, the chemical liquid or the mist may be prevented from being entered to the center side of wafer W to be discharged to the outside of wafer W, quickly. Accordingly, first chemical liquid nozzle 73, second chemical liquid nozzle 83, or other component (e.g., the rinse nozzle) may be prevented from being contaminated by the mist of the chemical liquid, and thus, the atmosphere in the vicinity of wafer W may be maintained cleanly.

Next, the structure of the component such as, for example, chemical liquid discharging ports 90, 95, which are described above and configured to perform a processing for wafer W from below, will be described. As illustrated in FIG. 3, first chemical liquid discharging port 90 is formed in an inner peripheral portion 31 of cup body 3, and a first chemical liquid supplying unit 92 that supplies the first chemical liquid such as, for example, SC-1 solution is connected to first chemical liquid discharging port 90 via a supplying pipe 92a. Similarly, as illustrated in FIG. 4, second chemical liquid discharging port 95 is formed in inner peripheral portion 31 of cup body 3, and a second chemical liquid supplying unit 97 that supplies the second chemical liquid such as, for example, HF solution is connected to second chemical liquid discharging port 95 via a supplying pipe 97a.

First chemical liquid discharging port 90 and second chemical liquid discharging port 95 may be configured such that the discharging directions of the discharged first chemical liquid and second chemical liquid have a component toward the radial direction outside of wafer W, respectively, as in first chemical liquid nozzle 73 and second chemical liquid nozzle 83. Therefore, the chemical liquids that are discharged from chemical liquid discharging ports 90, 95 to reach wafer W may be quickly scattered toward the radial direction outside of wafer W. As a result, first chemical liquid discharging port 90 and second chemical liquid discharging port 95 may be prevented from being contaminated by the mist of the chemical liquid, and thus, the atmosphere in the vicinity of wafer W may be maintained more cleanly.

As illustrated in FIG. 3, a rinse liquid discharging port 93 that discharges a rinse liquid toward the peripheral portion of the bottom surface of wafer W is formed in the upstream side of first chemical liquid discharging port 90 with respect to first rotation direction $R_1$. Similarly, as illustrated in FIG. 4, a rinse liquid discharging port 98 that discharges a rinse liquid toward the peripheral portion of the bottom surface of wafer W is formed in the upstream side of second chemical liquid discharging port 95 with respect to second rotation direction $R_2$. By disposing rinse liquid discharging ports 93, 98 in the upstream side compared to chemical liquid discharging ports 90, 95, the chemical liquids discharged from chemical liquid discharging ports 90, 95 may be prevented from being adhered to rinse liquid discharging ports 93, 98. Rinse liquid discharging ports 93, 98 are formed in the center side of wafer W as compared to chemical liquid discharging ports 90, 95. As a result, an area on the bottom surface of wafer W where the rinse liquid discharged from rinse liquid discharging ports 93, 98 is formed in the center side of wafer W as compared to chemical liquid supplying positions 91a, 96a on the bottom surface of wafer W. That is, as in the top surface of wafer W, the rinse liquid is supplied from the center side of wafer W compared to the chemical liquid even in the bottom surface of wafer W. Therefore, an area on which the chemical liquid flows of the bottom surface of wafer W may be surely cleaned by the rinse liquid.

Meanwhile, the arrangement of rinse liquid discharging ports 93, 98 is not limited specifically, as long as the rinse liquid is supplied from the center side of wafer W compared to the chemical liquid. For example, chemical liquid discharging ports 90, 95 and rinse liquid discharging ports 93, 98 may be disposed in parallel along the circumference direction of wafer W.

Figure 8:
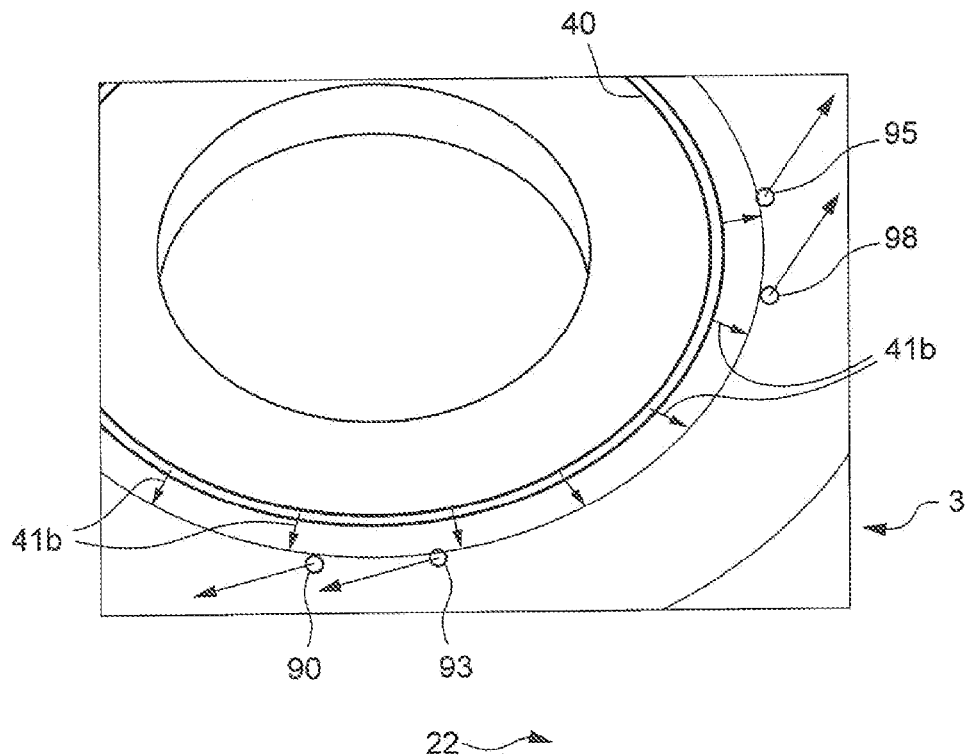
FIG. 8 is a view illustrating a chemical liquid discharging port, a rinse liquid discharging port, and a cleaning liquid discharging port all of which are formed in a cup body.

As illustrated in FIG. 5, a cleaning liquid discharging port 40 disposed in the center side of wafer W compared to chemical liquid discharging ports 90, 95 and rinse liquid discharging ports 93, 98 and configured to discharge a cleaning liquid such as, for example, DIW toward a flange portion 44 of cup body 3, may be formed in inner peripheral portion 31 of cup body 3. Cleaning liquid discharging port 40, as illustrated in FIGS. 3 to 5, and FIG. 8, has a slit type shape that extends along the circumference direction of wafer W. Meanwhile, FIG. 8 is a perspective view illustrating cup body 3 in which cleaning liquid discharging port 40, chemical liquid discharging ports 90, 95, or rinse liquid discharging ports 93, 98 are formed thereon when viewed from above obliquely. When cleaning liquid discharging port 40 is formed, as illustrated in FIG. 8, liquid current 41b that proceeds from cleaning liquid discharging port 40 to the outside may be generated in all the direction. Therefore, flange portion 44 to which the chemical liquid is adhered may be cleaned by the cleaning liquid across the entire area thereof. The specific configuration to supply a cleaning liquid to cleaning liquid discharging port 40 is not limited especially, but, a ring shaped buffer 40a that stores the cleaning liquid may be connected to cleaning liquid discharging port 40 and cleaning liquid supplying unit 41 that supplies a cleaning liquid may be connected to buffer 40a via a supplying pipe 41a, as illustrated in FIGS. 3 to 5.

As illustrated in FIG. 5, a gas supplying port 42 disposed in the center side of wafer W compared to chemical liquid discharging ports 90, 95 and rinse liquid discharging ports 93, 98, and configured to discharge gas toward the bottom surface of wafer W, may be formed in inner peripheral portion 31 of cup body 3. A gas supplying unit 43 that supplies gas such as, for example, a dry air or an inert gas such as, for example, a nitride, is connected to gas supplying port 42 via a supplying pipe 43a. When the gas is sprayed to the bottom surface of wafer W using gas supplying port 42, the chemical liquid or rinse liquid may be prevented from being entered to the center side of wafer W. The bottom surface of wafer W after the liquid processing by the chemical liquid or rinse liquid may be quickly dried. Unlike flange portion 44 which is cleaned by cleaning liquid discharging port 40 as described above, wafer W to which gas is sprayed by gas supplying port 42 may be freely rotated by rotation driving shaft 22. For that reason, even though gas supplying port 42 is configured in a dot shape other than the slit type, gas may be sprayed from gas supplying port 42 to the bottom surface of wafer W along the circumference direction of wafer W without a gap.

(Liquid Receiving Space of Cup Body)

Next, a problem to be considered for liquid receiving space 35 of cup body 3 and a preferable configuration example to solve the problem will be described.

As described above, the liquid processing performed by substrate processing apparatus 1 according to the present exemplary embodiment is a liquid processing for the peripheral portion of wafer W. That is, the area of wafer W to be processed is limited. For that reason, the amount of the chemical liquid or rinse liquid used in substrate processing apparatus 1 according to the present exemplary embodiment becomes decreased as compared to a substrate processing apparatus that performs a liquid processing for the entire area of wafer W. For example, the amount of the chemical liquid discharged with respect to wafer W at the liquid processing, is about 30 ml per minute. In this case, the chemical liquid within liquid receiving space 35 of cup body 3 becomes lacking in fluidity, and thus, it is considered that it takes a time for the chemical liquid to reach drain port 38. When the chemical liquid stays for a long time within liquid receiving space 35, foreign substances may be generated by mixing the mist of the chemical liquid or other chemical liquid with each other, and thus, the stay is undesirable.

According to the present exemplary embodiment, the bottom surface of cup body 3 is configured as a liquid receiving bottom surface 39 that is inclined downwardly toward drain port 38, and drain port 38 is formed in the lowest liquid receiving bottom surface 39b of liquid receiving bottom surface 39. The height of liquid receiving bottom surface 39b is lower by Ah than that of highest liquid receiving bottom surface 39a (which is in the highest position) among liquid receiving bottom surface 39. In this way, when liquid receiving bottom surface 39 is designed to be inclined downwardly toward drain port 38, the flow toward drain port 38 may be generated in the chemical liquid within liquid receiving space 35. As a result, the chemical liquid that remains within liquid receiving space 35 may reach drain port 38 more quickly. Meanwhile, liquid receiving bottom surface 39a which is in the highest position and drain port 38 may be formed to be away by 180 degrees. In this case, a slope is formed toward drain port 38 in both left and right sides from liquid receiving bottom surface 39a which is in the highest position. In the present exemplary embodiment, liquid receiving bottom surface 39a located at the highest position is disposed in an area which is included in an acute angle formed by a straight line that connects central point $W_C$ of wafer W and central point 74c of first chemical liquid supplying position 74a and a straight line that connects central point $W_C$ of wafer W and central point 84c of second chemical liquid supplying position 84a, among liquid receiving space 35 of cup body 3. Specifically, liquid receiving bottom surface 39a located at the highest position is disposed in a position which is an upstream side than a position corresponding to first chemical liquid supplying position 74a along first rotation direction $R_1$ and is an upstream side than a position corresponding to second chemical liquid supplying position 84a along second rotation direction $R_2$ in cup body 3.

As illustrated in FIGS. 2 and 5, a carrier liquid supplying port 35b that supplies a carrier liquid onto liquid receiving bottom surface 39 may be formed in liquid receiving bottom surface 39a located at the highest position. Herein, "carrier liquid" indicates a liquid which is supplied into liquid receiving space 35 so that the flow rate of the liquid within liquid receiving space 35 is increased and thus, a stable liquid current toward drain port 38 along liquid receiving bottom surface 39 is formed. The type of the carrier liquid is not limited especially, but for example, DIW is used.

Carrier liquid supplying port 35b may be formed between first chemical liquid supplying position 74a and second chemical liquid supplying position 84a, and, may be formed in a position corresponding to an intermediate point, as illustrated in FIG. 2. "Position corresponding to intermediate point" indicates that carrier liquid supplying port 35b is disposed on a straight line which passes central point $W_C$ of wafer W and the intermediate point of the straight line that connecting central point 74c of first chemical liquid supplying position 74a and central point 84c of second chemical liquid supplying position 84a. When carrier liquid supplying port 35b is formed in the position, both the first chemical liquid that is discharged from first chemical liquid nozzle 73 to reach liquid receiving space 35 and the second chemical liquid that is discharged from second chemical liquid nozzle 83 to reach liquid receiving space 35 may effectively proceed toward drain port 38.

Figure 9:
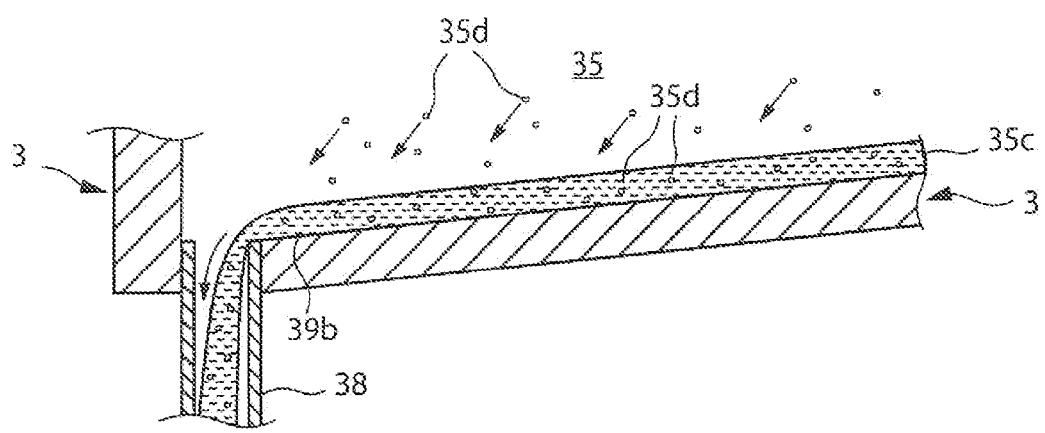
FIG. 9 is a view schematically illustrating the action of a liquid receiving bottom surface, which is formed obliquely, of a liquid receiving space of the cup.

FIG. 9 is a schematic view illustrating a state where a liquid 35d such as, for example, the liquid which is scattered from wafer W and reaches liquid receiving space 35 proceeds toward drain port 38. As illustrated in FIG. 9, a liquid current that proceeds toward drain port 38 along liquid receiving bottom surface 39 is formed by the slope in liquid receiving bottom surface 39 and carrier liquid 35c supplied from carrier liquid supplying port 35b. As a result, even though the amount of liquid 35d that is scattered from wafer W and reaches liquid receiving space 35 is small, liquid 35d may quickly reach drain port 38 with carrier liquid 35c as a carrier. Therefore, for example, chemical liquid may be prevented from staying for a long time within liquid receiving space 35.

Meanwhile, the slope degree of liquid receiving bottom surface 39 or the amount of carrier liquid 35c supplied from carrier liquid supplying port 35b is not limited specifically, but is set appropriately according to, for example, the amount of liquid 35d that is scattered from wafer W and reaches liquid receiving space 35.

(Control Unit)

Substrate processing apparatus 1 includes a control unit 7 which controls the entire operation of substrate processing apparatus 1. Control unit 7 controls the operation of all functional components of substrate processing apparatus 1 (for example, rotation driving shaft 22, elevating mechanisms 47, 48, cleaning liquid supplying unit 41, gas supplying unit 43, nozzle driving units 70, 80, chemical liquid supplying units 75, 85, 92, 97, and rinse liquid supplying units 78, 88, 94, 99). Control unit 7 may be implemented using, for example, a general purpose computer as a hardware and a program (an apparatus control program and a processing recipe) to operate the computer as a software. The software may be stored on a storage medium such as, for example, a hard disc drive which is fixedly provided in the computer, or on a storage medium such as, for example, a CD-ROM, a DVD, and a flash memory which are removably set in the computer. A processor calls and executes a predetermined processing recipe from the storage medium based on, for example, instructions from a user interface as needed, and as a result, each functional component of substrate processing apparatus 1 is operated under the control of control unit 7 to perform a predetermined processing.

Next, a series of processes will be described, which removes unnecessary films or substances that remain in the peripheral portion of wafer W using substrate processing apparatus as described above.

<Wafer Carrying-In and Installation Process>

At first, cover member 5 is retracted upwardly and cup body 3 is retracted downwardly. And then, wafer W is carried-in to the inside of substrate processing apparatus 1 to be disposed on substrate holding unit 21. Substrate holding unit 21 holds wafer W using, for example, an adsorption. And then, cup body 3 ascends such that wafer W is disposed in opening 46 of cup body 3. Further, cover member 5 descends such that opening 46 of cup body 3 is covered by cover member 5. Accordingly, a state for a liquid processing is realized in which cover member 5 faces the top surface of wafer W through a predetermined space, as illustrated in FIGS. 3 to 5.

Next, clean gas is supplied from gas supplying port 49 toward the top surface of wafer W. Therefore, a gas flow that proceeds from the center side of wafer W to the outside is generated in a space between wafer W and cover member 5. In processes as below, the gas is always supplied from gas supplying port 49 toward wafer W, as long as it is not mentioned specifically.

<First Chemical Liquid Processing>

Next, a liquid processing will be described with reference to FIGS. 10A to 10F. First, a first chemical liquid processing that discharges a first chemical liquid (SC-1 solution) toward wafer W will be described.

Figure 10A:
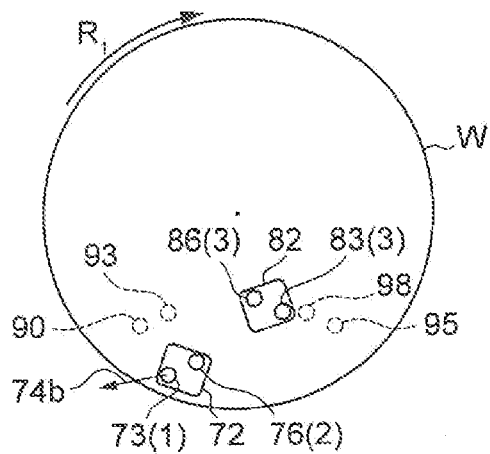
FIGS. 10A to 10F are views illustrating a substrate processing method according to an exemplary embodiment of the present disclosure.

Rotation driving unit 24 rotates wafer W (that is, substrate holding unit 21 that holds wafer W) in first rotation direction $R_1$. Wafer W is rotated at, for example, 2,000 rpm to 3,000 rpm. As illustrated in FIG. 10A, first chemical liquid nozzle 73 moves to the first out-side position. At that time, second chemical liquid nozzle 83 is disposed in the second stand-by position which is disposed in the center side of wafer W compared to the second processing position as described below in which second chemical liquid nozzle 83 is disposed when second chemical liquid nozzle 83 discharges the second chemical liquid toward the peripheral portion of wafer W. Next, the dummy dispense of the first chemical liquid is initiated in first chemical liquid nozzle 73, and as a result, liquid current 74b of the first chemical liquid stabilizes.

Figure 10B:
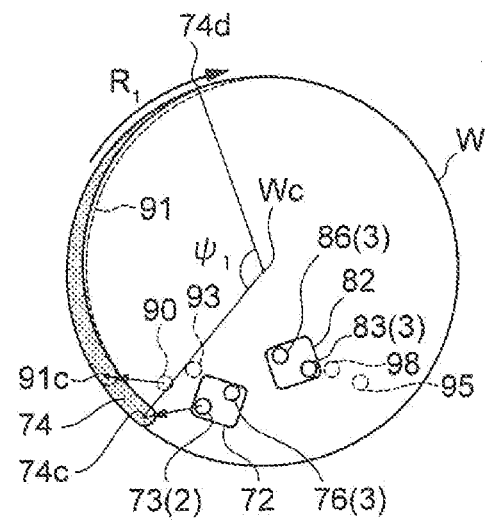

When liquid current 74b stabilizes, first chemical liquid nozzle 73 moves to the first processing position while the first chemical liquid is discharged. Therefore, as illustrated in FIG. 10B, the first chemical liquid is supplied to the peripheral portion of the top surface of wafer W. Further, the first chemical liquid is supplied to the peripheral portion of the bottom surface of wafer W using first chemical liquid discharging port 90. In FIG. 10B, the first chemical liquid that remains on the top surface of wafer W is indicated as the reference numeral 74, and the first chemical liquid that remains on the bottom surface of wafer W is indicated as the reference numeral 91. As illustrated in FIG. 10B, first chemical liquids 74, 91, which are supplied to the peripheral portion of wafer W that rotates in first rotation direction $R_1$, move to the outside of wafer W caused by the centrifugal force by the rotation and are scattered to the outside of wafer W. The first chemical liquid scattered to the outer side of wafer W is discharged from drain port 38 to the outside through liquid receiving space 35 of cup body 3. At that time, carrier liquid supplying port 35a may supply carrier liquid 35c onto liquid receiving bottom surface 39 through carrier liquid supplying port 35b. Accordingly, the first chemical liquid within liquid receiving space 35 may reach drain port 38 more quickly.

In wafer W, the position where first chemical liquid 74 is scattered from wafer W depends on parameters such as, for example, a speed of the first chemical liquid discharged from first chemical liquid nozzle 73, a rotation speed of wafer W, and a distance from first chemical liquid supplying position 74a as described above to the lateral end of wafer W. In the present exemplary embodiment, the parameters are set such that a rotation angle $\psi_1$ of wafer W which is required until the first chemical liquid that reaches wafer W is scattered from wafer W ("scattering angle $\psi_1$") is less than central angle $\phi_1$ between chemical liquid nozzles as described above. Accordingly, first chemical liquid 74 supplied to the peripheral portion of the top surface of wafer W may be prevented from reaching the vicinity of second chemical liquid nozzle 83. Meanwhile, scattering angle $\psi_1$ as described above is defined by an angle which is formed between a straight line that connects central point 74c of first chemical liquid supplying position 74a and central point $W_C$ of wafer W and a straight line formed by connecting central point $W_C$ of wafer W and a point where first chemical liquid 74 is scattered (a point that is indicated as a reference numeral 74d in FIG. 10B).

Each of the parameters as described above such as, for example, the rotation speed of wafer W may be adjusted such that point 74d where first chemical liquid 74 is scattered is disposed in the upstream side of drain port 38 with respect to first rotation direction $R_1$. Accordingly, the first chemical liquid that is scattered from wafer W and reaches liquid receiving space 35 may reach drain port 38 more quickly. Further, in this case, the mist caused by the scattered first chemical liquid is mainly generated at the upstream side of drain port 38 with respect to first rotation direction $R_1$. The generated mist is quickly discharged from exhaust port 37 formed in the vicinity of drain port 38. As a result, the mist may be prevented from being flown at the downstream side of drain port 38. As a result, the atmosphere in the vicinity of wafer W may be maintained more cleanly.

As described above, first chemical liquid nozzle 73 is formed such that the discharging direction of the discharged first chemical liquid has a component toward the radial direction outside of wafer W. For that reason, first chemical liquid 74 supplied to the peripheral portion of wafer W may move to the outside of wafer W more quickly, and thus, scattering angle $\psi_1$ becomes more decreased. Accordingly, first chemical liquid 74 supplied to the peripheral portion of the top surface of wafer W may be prevented more surely from reaching the vicinity of second chemical liquid nozzle 83. As in first chemical liquid nozzle 73, first chemical liquid discharging port 90 may be formed such that the discharging direction of the discharged first chemical liquid has a component toward the radial direction outside of wafer W.

After the processing for the peripheral portion of wafer W by the first chemical liquid is completed, first nozzle driving unit 70 moves first chemical liquid nozzle 73 discharging the first chemical liquid continuously to the first out-side position. As a result, the supply of the first chemical liquid to wafer W may be completed while the stable liquid current of the first chemical liquid is maintained to the last. After first chemical liquid nozzle 73 reaches the first out-side position, first chemical liquid nozzle 73 stops the discharging of the first chemical liquid.

<First Rinse Processing>

Figure 10C:
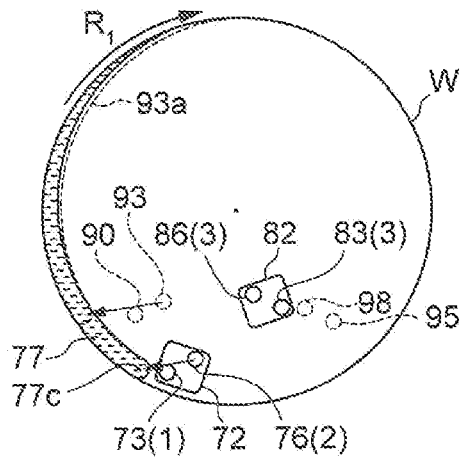

After the processing for the peripheral portion of wafer W by the first chemical liquid is completed, first rinse nozzle 76 that is disposed in the processing position (rinse processing position) discharges a rinse liquid toward the peripheral portion of the top surface of wafer W, as illustrated in FIG. 10C. In FIG. 10C, the rinse liquid that remains on the top surface of wafer W is indicated as a reference numeral 77. Rinse liquid discharging port 93 discharges the rinse liquid toward the peripheral portion of the bottom surface of wafer W. In FIG. 10C, the rinse liquid that remains on the bottom surface of wafer W is indicated as a reference numeral 93a. Meanwhile, the supplying position of the rinse liquid that is discharged from first rinse nozzle 76 and rinse liquid discharging port 93 and reaches wafer W is disposed in the center side of wafer W, as compared to the supplying position of the first chemical liquid that is discharged from first chemical liquid nozzle 73 and first chemical liquid discharging port 90 and reaches wafer W. Therefore, each area on which the first chemical liquid flows, of the top surface and the bottom surface of wafer W, may be surely cleaned by the rinse liquid.

However, as described above, when first chemical liquid nozzle 73 is disposed in the first out-side position, first rinse nozzle 76 is disposed in the processing position. As a result, as soon as first chemical liquid nozzle 73 stops supplying the first chemical liquid to wafer W, first rinse nozzle 76 may initiate supplying a rinse liquid toward the peripheral portion of wafer W. Therefore, the rinse liquid may be supplied to wafer W before the first chemical liquid is dried on wafer W. As a result, for example, a particle capable of being generated caused by the dry of the first chemical liquid may be surely prevented from being formed on wafer W.

After the first chemical liquid that remains in the peripheral portion of wafer W is removed by the rinse liquid, first rinse nozzle 76 and rinse liquid discharging port 93 stop the discharge of the rinse liquid. And then, the rotation of wafer W in first rotation direction $R_1$ stops. Further, first chemical liquid nozzle 73 moves toward the first stand-by position.

<Second Chemical Liquid Processing>

Figure 10D:
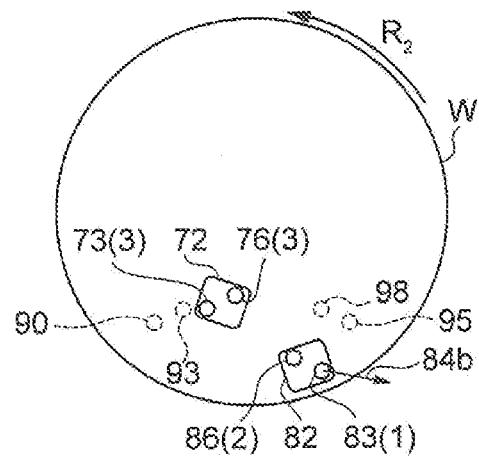

Next, rotation driving unit 24 rotates wafer W (that is, substrate holding unit 21 that holds wafer W) in second rotation direction $R_2$. Wafer W is rotated at, for example, 2,000 rpm to 3,000 rpm. As illustrated in FIG. 10D, second chemical liquid nozzle 83 moves to the second out-side position. At that time, first chemical liquid nozzle 73 is disposed in the first stand-by position which is in the center side of wafer W compared to the first processing position as described above. Next, the dummy dispense of the second chemical liquid is initiated in second chemical liquid nozzle 83, and as a result, liquid current 84b of the second chemical liquid stabilizes.

Figure 10E:
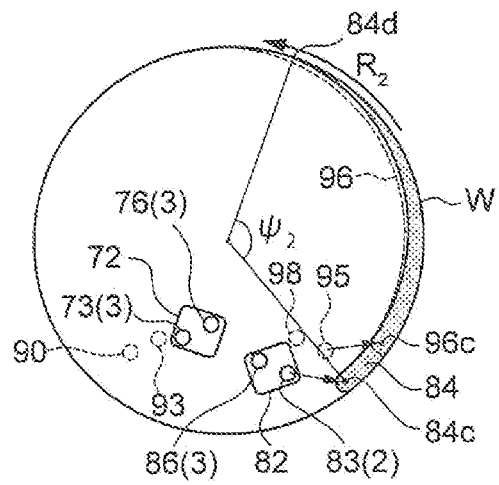

When liquid current 84b stabilizes, second chemical liquid nozzle 83 moves to the second processing position while the second chemical liquid is discharged. Therefore, as illustrated in FIG. 10E, the second chemical liquid is supplied to the peripheral portion of the top surface of wafer W. Further, the second chemical liquid is supplied to the peripheral portion of the bottom surface of wafer W using second chemical liquid discharging port 95. In FIG. 10E, the second chemical liquid that remains on the top surface of wafer W is indicated as the reference numeral 84, and the second chemical liquid that remains on the bottom surface of wafer W is indicated as the reference numeral 96. As illustrated in FIG. 10E, second chemical liquids 84, 96, which are supplied to the peripheral portion of wafer W that rotates in second rotation direction $R_2$, move to the outside of wafer W caused by the centrifugal force by the rotation and are scattered to the outside of wafer W. The second chemical liquid scattered to the outer side of wafer W is discharged from drain port 38 to the outside through liquid receiving space 35 of cup body 3. At that time, carrier liquid supplying port 35b may supply carrier liquid 35c onto liquid receiving bottom surface 39a. Accordingly, the second chemical liquid within liquid receiving space 35 may reach drain port 38 more quickly.

Herein, as in first chemical liquid 74 as described above, even for second chemical liquid 84, a scattering angle $\psi_2$ thereof is set to be equal to or less than central angle $\phi_1$ between the chemical liquid nozzles as described above. Accordingly, second chemical liquid 84 supplied to the peripheral portion of the top surface of wafer W may be prevented from reaching the vicinity of first chemical liquid nozzle 73. A point 84d where second chemical liquid 84 is scattered is disposed in the upstream side of drain port 38 with respect to second rotation direction $R_2$. Accordingly, the mist caused by the scattered second chemical liquid may be prevented from being flown to the downstream side of drain port 38 with respect to second rotation direction $R_2$.

As in first chemical liquid nozzle 73 described above, second chemical liquid nozzle 83 is formed such that the discharging direction of the discharged second chemical liquid has a component toward the radial direction outside of wafer W. Accordingly, second chemical liquid 84 supplied to the peripheral portion of the top surface of wafer W may be prevented more surely from reaching the vicinity of first chemical liquid nozzle 73. Meanwhile, second chemical liquid discharging port 95 may be formed such that the discharging direction of the discharged second chemical liquid has a component toward the radial direction outside of wafer W.

After the processing for the peripheral portion of wafer W by the second chemical liquid is completed, second nozzle driving unit 80 moves second chemical liquid nozzle 83 discharging the second chemical liquid continuously to the second out-side position. As a result, the supply of the second chemical liquid to wafer W may be completed while the stable liquid current of the second chemical liquid is maintained to the last. After second chemical liquid nozzle 83 reaches the second out-side position, second chemical liquid nozzle 83 stops the discharging of the second chemical liquid.

<Second Rinse Processing>

Figure 10F:
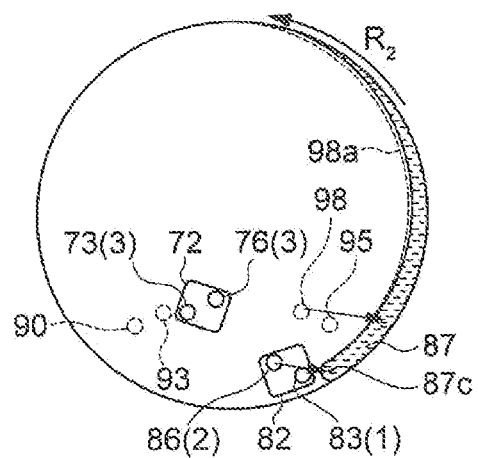

After the processing for the peripheral portion of wafer W by the second chemical liquid is completed, second rinse nozzle 86 that is disposed in the processing position (a rinse processing position) discharges a rinse liquid toward the peripheral portion of the top surface of wafer W, as illustrated in FIG. 10F. In FIG. 10F, the rinse liquid that remains on the top surface of wafer W is indicated as a reference numeral 87. Rinse liquid discharging port 98 discharges the rinse liquid toward the peripheral portion of the bottom surface of wafer W. In FIG. 10F, the rinse liquid that remains on the bottom surface of wafer W is indicated as a reference numeral 98a. Meanwhile, the supplying position of the rinse liquid that is discharged from second rinse nozzle 86 and rinse liquid discharging port 98 and reaches wafer W is disposed in the center side of wafer W, as compared to the supplying position of the second chemical liquid that is discharged from second chemical liquid nozzle 83 and second chemical liquid discharging port 95 and reaches wafer W. Therefore, each area of the top surface and the bottom surface of wafer W on which the second chemical liquid flows, may be surely cleaned by the rinse liquid.

Herein, as in first chemical liquid nozzle 73 and first rinse nozzle 76 described above, when second chemical liquid nozzle 83 is disposed in the second stand-by position, second rinse nozzle 86 is disposed in the processing position thereof. As a result, as soon as second chemical liquid nozzle 83 stops supplying the second chemical liquid to wafer W, second rinse nozzle 86 may initiate supplying a rinse liquid toward the peripheral portion of wafer W. Therefore, the rinse liquid may be supplied to wafer W before the second chemical liquid is dried on wafer W. As a result, for example, a particle capable of being generated caused by the dry of the second chemical liquid may be surely prevented from being formed on wafer W.

After the second chemical liquid that remains in the peripheral portion of wafer W is removed by the rinse liquid, second rinse nozzle 86 and rinse liquid discharging port 98 stop the discharge of the rinse liquid. Further, second chemical liquid nozzle 83 moves toward the second stand-by position.

<Dry Processing>

After the second rinse processing as described above, wafer W is continuously rotated. As a result, the rinse liquid that remains on wafer W is scattered by the centrifugal force. Further, a gas is sprayed from gas supplying port 42 toward the bottom surface of wafer W. As such, the rinse liquid that remains on wafer W is removed. In order to perform the dry processing more effectively, the rotation speed of wafer W may be set to a speed higher than the rotation speed during the chemical liquid processing and the rinse processing as described above.

<Wafer Carrying-Out>

After the dry processing as described above, the rotation of wafer W stops, and cover member 5 is retracted upwardly. Next, cup body 3 descends to wafer W transferring position. And then, wafer W is carried-out from substrate processing apparatus 1 to the outside. In this way, a series of liquid processing for wafer W is completed.

<Cleaning Processing>

After the series of liquid processing for wafer W is completed, cleaning liquid discharging port 40 discharges a cleaning liquid such as, for example, DIW toward flange portion 44 of cup body 3. Accordingly, for example, the chemical liquid adhered to flange portion 44 may be washed. Further, first chemical liquid nozzle-cleaning mechanism 53 discharges a cleaning liquid such as, for example, DIW toward first chemical liquid nozzle 73 and first rinse nozzle 76. During the discharging of the cleaning liquid, first chemical liquid nozzle 73 and first rinse nozzle 76 may move back and forth by head support shaft 71. Therefore, the cleaning liquid may reach the entire first chemical liquid nozzle 73 and the entire first rinse nozzle 76. Similarly, even though it is not illustrated, a second chemical liquid nozzle-cleaning mechanism discharges a cleaning liquid such as, for example, DIW from a cleaning liquid discharging port toward second chemical liquid nozzle 83 and second rinse nozzle 86. Accordingly, for example, the chemical liquid adhered to chemical liquid nozzles 73, 83 and rinse nozzles 76, 86 may be washed. In this way, before following wafer W is carried-in, the chemical liquid that remains within substrate processing apparatus 1 may be washed, and as a result, the atmosphere within substrate processing apparatus 1 may be cleaned.

Meanwhile, the above cleaning processing may perform every liquid processing for wafers W of predetermined number of sheets, does not perform every liquid processing for a single wafer W. Further, after a chemical liquid nozzle or rinse nozzle is cleaned by each chemical liquid nozzle-cleaning mechanism, gas, such as, nitride may be discharged from cleaning liquid discharging port 54b toward the rinse nozzle. Accordingly, the drying of the chemical liquid nozzle or rinse nozzle may be facilitated.

As described above, according to the present exemplary embodiment, rotation driving unit 24 rotates a wafer in first rotation direction $R_1$ when first chemical liquid nozzle 73 discharges the first chemical liquid, and rotates wafer W in second rotation direction $R_2$ when second chemical liquid nozzle 83 discharges the second chemical liquid. As a result, the first chemical liquid discharged from first chemical liquid nozzle 73 may be prevented from reaching the vicinity of second chemical liquid nozzle 83, and the second chemical liquid discharged from second chemical liquid nozzle 83 may be prevented from reaching the vicinity of first chemical liquid nozzle 73. Accordingly, the chemical liquid discharged from one of the chemical liquid nozzles may be prevented from being adhered to the other of the chemical liquid nozzles, and thus, the first chemical liquid and the second chemical liquid may be prevented from being mixed with each other on the chemical liquid nozzles. As a result, the atmosphere in the vicinity of wafer W may be maintained cleanly.

According to the present exemplary embodiment, central angle $\phi_1$ between the chemical liquid nozzles formed by connecting central angle $W_C$ of wafer W, first chemical liquid supplying position 74a and second chemical liquid supplying position 84a becomes more than 180 degrees. Therefore, a distance between first chemical liquid nozzle 73 and second chemical liquid nozzle 83 may be obtained longer. As a result, the chemical liquid discharged from one of the chemical liquid nozzles may be surely prevented from reaching the vicinity of the other of the chemical liquid nozzles.

According to the present exemplary embodiment, during discharging the first chemical liquid by first chemical liquid nozzle 73, second chemical liquid nozzle 83 is disposed in the second stand-by position which is in the center side of wafer W compared to the second processing position. Further, during discharging the second chemical liquid by second chemical liquid nozzle 83, first chemical liquid nozzle 73 is disposed in the first stand-by position which is in the center side of wafer W compared to the first processing position. Accordingly, the chemical liquid discharged from one of the chemical liquid nozzles may be further prevented from being adhered to the other of the chemical liquid nozzles, and thus, the first chemical liquid and the second chemical liquid may be further prevented from being mixed with each other.

According to the present exemplary embodiment, chemical liquid nozzles 73, 83 are configured such that the discharging direction of each of the discharged chemical liquids has a component toward the radial direction outside of wafer W, and thus, the chemical liquid that reaches wafer W may be scattered quickly. Accordingly, the first chemical liquid and the second chemical liquid may be further prevented from being mixed with each other on the chemical liquid nozzles. As a result, the atmosphere in the vicinity of wafer W may be further maintained cleanly.

According to the present exemplary embodiment, the rotation direction of wafer W is changed according to the discharged chemical liquid and central angle $\phi_1$ between the chemical liquid nozzles is set to an angle more than 180 degrees, and thus, in liquid receiving space 35 of cup body 3, the paths which the first chemical liquid and the second chemical liquid may be separated. Therefore, the first chemical liquid and the second chemical liquid may be prevented from being mixed with each other in liquid receiving space 35, thereby maintaining the atmosphere around wafer W more cleanly. As described above, by forming a slope in liquid receiving bottom surface 39 of liquid receiving space 35 or supplying a carrier liquid 35c to liquid receiving bottom surface 39 of liquid receiving space 35, the chemical liquid in liquid receiving space 35 may be discharged more quickly, and thus, the first chemical liquid and the second chemical liquid may be prevented from being mixed with each other. As a result, the atmosphere in the vicinity of wafer W may be maintained more cleanly.

According to the present exemplary embodiment, the chemical liquid is supplied to the peripheral portion of wafer, and thus, the liquid that reaches wafer W may be scattered quickly by the centrifugal force. As described above, chemical liquid nozzles 73, 83 are formed such that the discharging direction of each of the discharged first chemical liquid has a component toward the radial direction outside of wafer W. As a result, the chemical liquid may be scattered more quickly from wafer W. In addition, a clean gas is supplied toward the top surface of wafer W from gas supplying port 49, and thus, a gas current toward the outside from the center side of wafer W around wafer W may be generated. As a result, the chemical liquid or the mist may be prevented from being entered to the center side of wafer W. Accordingly, first chemical liquid nozzle 73, second chemical liquid nozzle 83, or other component (e.g., the rinse nozzle) may be prevented from being contaminated by the mist or the chemical liquid, and thus, the atmosphere in the vicinity of wafer W may be maintained more cleanly.

Meanwhile, various modifications may be applied to the present exemplary embodiments. Hereinafter, an example of the modifications will be described.

(Modified Example of Liquid Processing Method)

In the present exemplary embodiment as described above, an example is illustrated in which the first chemical liquid and the second chemical liquid are discharged from the same drain port 38. However, it is not limited thereto, drain port 38 that discharges the first chemical liquid and drain port 38 that discharges the second chemical liquid may be formed separately in liquid receiving bottom surface 39b of cup body 3. Accordingly, the first chemical liquid and the second chemical liquid may be prevented from being mixed with each other on drain port 38. As a result, the atmosphere in the vicinity of wafer W may be maintained more cleanly.

(Modified Example of Liquid Processing Method)

In the present exemplary embodiment as described above, an example is illustrated where, while one of the chemical liquid nozzles discharges the chemical liquid, the other chemical liquid nozzle is disposed in the stand-by position which is in the center side of wafer W compared to the processing position thereof. However, it is not limited thereto, while one of the chemical liquid nozzle discharges the chemical liquid, the other chemical liquid nozzle may be disposed in the processing position. The examples as described above will be described with reference to FIGS. 11A to 11F.

Figure 11A:
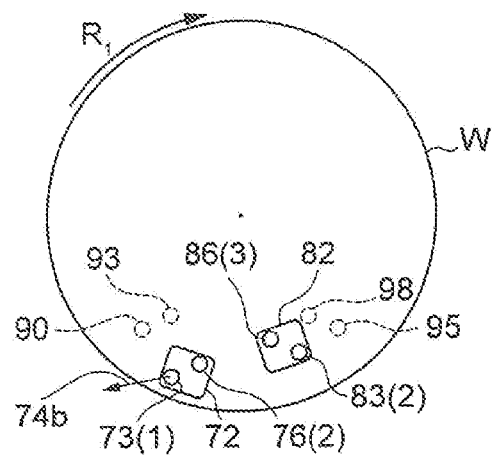
FIGS. 11A to 11F are views illustrating a substrate processing method according to a modified embodiment of the present disclosure.
Figure 11B:
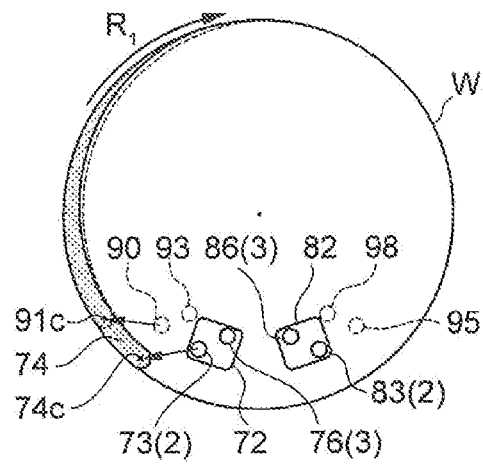
Figure 11C:
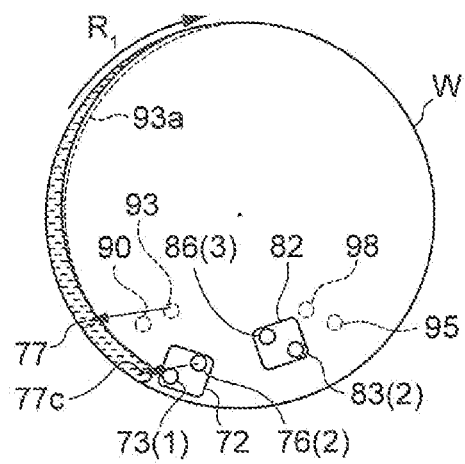
Figure 11D:
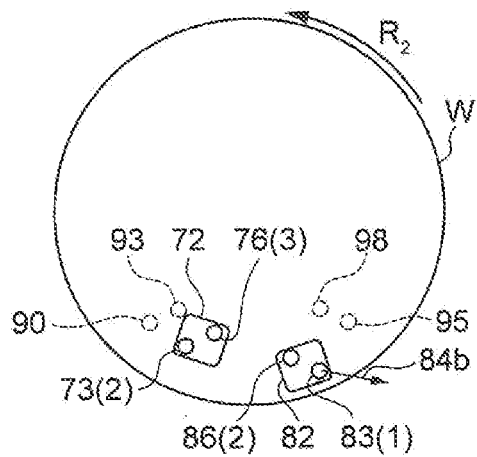

FIGS. 11A to 11F are views illustrating the liquid processing based on the present modified embodiment, and correspond to FIGS. 10A to 10F in the present exemplary embodiment as described above. In the present modified embodiment, as illustrated in FIG. 11B, when first chemical liquid nozzle 73 discharges the first chemical liquid toward the peripheral portion of wafer W, second chemical liquid nozzle 83 is disposed in the second processing position other than the second stand-by position. Even in the case, the rotation direction of wafer W or central angle $\phi_1$ between the chemical liquid nozzles as described above is set such that the first chemical liquid supplied to the peripheral portion of the top surface of wafer W from first chemical liquid nozzle 73 does not reach the vicinity of second chemical liquid nozzle 83. Accordingly, the first chemical liquid and the second chemical liquid may be prevented from being mixed with each other on second chemical liquid nozzle 83.

Figure 11E:
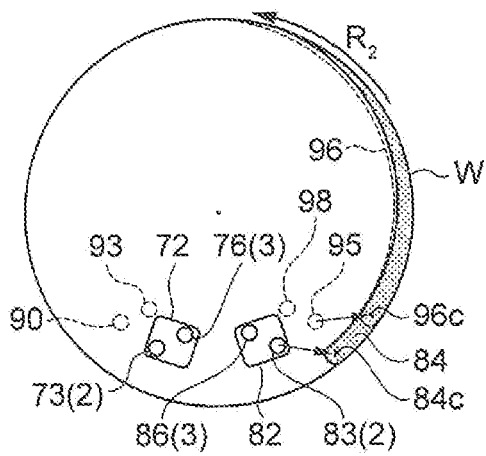
Figure 11F:
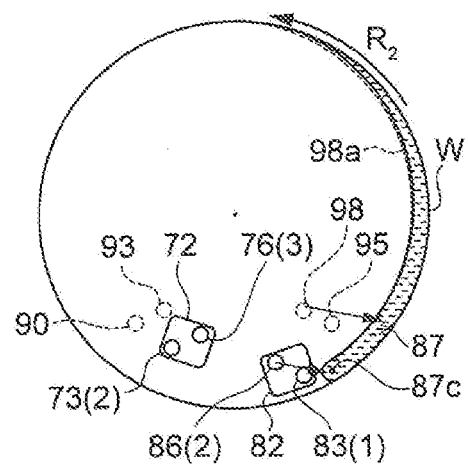

In the present modified embodiment, as illustrated in FIG. 11E, when second chemical liquid nozzle 83 discharges the second chemical liquid toward the peripheral portion of wafer W, first chemical liquid nozzle 73 is disposed in the first processing position other than the first stand-by position. Even in the case, the rotation direction of wafer W or central angle $\phi_1$ between the chemical liquid nozzles as described above is set such that the second chemical liquid supplied to the peripheral portion of the top surface of wafer W from second chemical liquid nozzle 83 does not reach the vicinity of first chemical liquid nozzle 73. Accordingly, the first chemical liquid and the second chemical liquid may be prevented from being mixed with each other on first chemical liquid nozzle 73.

(Modified Example of Rinse Nozzle Arrangement)

In the present exemplary embodiment as described above, an example is illustrated where first rinse nozzle 76 is disposed to be close to the center side of wafer W compared to first chemical liquid nozzle 73. However, it is not limited thereto, as illustrated in, for example, FIGS. 12A to 12D, first chemical liquid nozzle 73 and first rinse nozzle 76 may be arranged in parallel along the circumference direction of wafer W. Hereinafter, the liquid processing in the present modified embodiment will be described. Further, in order to be simplified, a nozzle or discharging port other than first chemical liquid nozzle 73 and first rinse nozzle 76 may be omitted in FIG. 12.

Figure 12A:
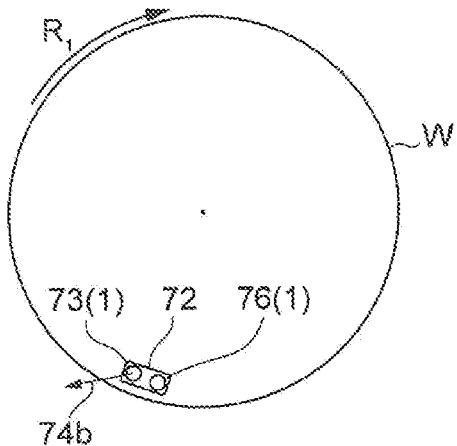
FIGS. 12A to 12D are views illustrating a rinse nozzle according to a modified embodiment.
Figure 12B:
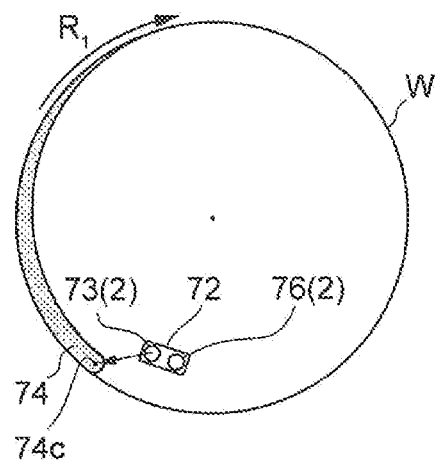
Figure 12C:
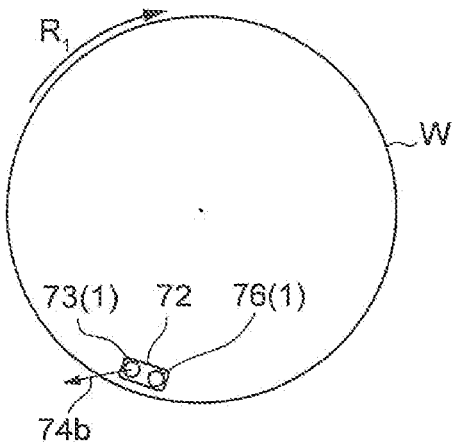
Figure 12D:
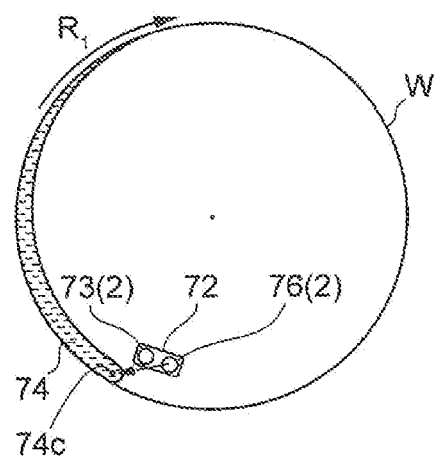

In the present modified embodiment, wafer W is rotated in first rotation direction $R_1$ first, and as illustrated in FIG. 12A, first chemical liquid nozzle 73 moves to the first out-side position to initiate a dummy dispense. Next, as illustrated in FIG. 12B, first chemical liquid nozzle 73 moves to the first processing position, and thus, the first chemical liquid is supplied to the peripheral portion of wafer W. And then, as illustrated in FIG. 12C, first chemical liquid nozzle 73 that continuously discharges the first chemical liquid moves toward the first out-side position. Right after first chemical liquid nozzle 73 reaches the first out-side position, first chemical liquid nozzle 73 stops discharging the first chemical liquid. Next, a first nozzle head 72 moves toward the center side of wafer W quickly, and first rinse nozzle 76 is disposed in the processing position. And then, as illustrated in FIG. 12D, first rinse nozzle 76 discharges rinse liquid 77 toward the peripheral portion of the top surface of wafer W. As a result, the first chemical liquid that remains on wafer W is washed out to be discarded.

According to the present modified embodiment, the discharging of the first chemical liquid from first chemical liquid nozzle 73 stops quickly and first rinse nozzle 76 moves quickly toward the processing position, and thus, a rinse liquid may be supplied to wafer W before the first chemical liquid is dried on wafer W.

Even though it is not illustrated, as in first rinse nozzle 76, second chemical liquid nozzle 83 and second rinse nozzle 86 may be arranged in parallel along the circumference direction of wafer W. Even in the case, the discharging of the second chemical liquid from second chemical liquid nozzle 83 stops quickly and second rinse nozzle 86 moves quickly toward the processing position, and thus, a rinse liquid may be supplied to wafer W before the second chemical liquid is dried on wafer W.

In the present exemplary embodiments and modified embodiments as described above, an example is illustrated where first chemical liquid nozzle 73 and first rinse nozzle 76 are adhered to first nozzle head 72, and thus, first chemical liquid nozzle 73 and first rinse nozzle 76 move together. However, it is not limited thereto, a nozzle driving unit (not illustrated) that moves first rinse nozzle 76 independently to first chemical liquid nozzle 73 may be installed separately from first nozzle driving unit 70. Similarly, a nozzle driving unit (not illustrated) that moves second rinse nozzle 86 independently to second chemical liquid nozzle 83 may be installed separately from second nozzle driving unit 80.

Meanwhile, several modified embodiments with respect to the exemplary embodiments as described above have been described, but it is possible to combine and apply a plurality of modified embodiments.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a substrate holding unit configured to hold a substrate in a horizontal direction to perform a liquid processing for a peripheral portion of the substrate by a chemical liquid;
a rotation driving unit configured to rotate the substrate holding unit to perform the liquid processing while rotating the substrate held by the substrate holding unit in a horizontal direction;
a first chemical liquid nozzle configured to discharge a first chemical liquid to a first chemical liquid supplying position on the peripheral portion of the substrate;
a second chemical liquid nozzle configured to discharge a second chemical liquid different from the first chemical liquid to a second chemical liquid supplying position on the peripheral portion of the substrate;
a first chemical liquid supplying unit connected to the first chemical liquid nozzle and configured to supply the first chemical liquid to the first chemical liquid nozzle; and
a second chemical liquid supplying unit connected to the second chemical liquid nozzle and configured to supply the second chemical liquid to the second chemical liquid nozzle,
wherein the substrate processing apparatus further comprises a control unit configured to control:
the first chemical liquid nozzle to discharge the first chemical liquid while rotating the substrate holding unit in the first rotation direction, and
the second chemical liquid nozzle to discharge the second chemical liquid while rotating the substrate holding unit in the second rotation direction, and
wherein the rotation driving unit rotates the substrate holding unit in a first rotation direction when the first chemical liquid nozzle discharges the first chemical liquid, and rotates the substrate holding unit in a second rotation direction, which is opposite to the first rotation direction, when the second chemical liquid nozzle discharges the second chemical liquid,
the first chemical liquid nozzle is configured such that a discharging direction of the first chemical liquid to be discharged is inclined into the first rotation direction, and
the second chemical liquid nozzle is configured such that a discharging direction of the second chemical liquid to be discharged is inclined into the second rotation direction.

2. The substrate processing apparatus of claim 1, wherein a central angle formed by connecting a center of the substrate, a central point of the first chemical liquid supplying position and a central point of the second chemical liquid supplying position becomes more than 180 degrees, when the central angle is viewed along the first rotation direction with respect to the first chemical liquid supplying position as a reference such that the first chemical liquid and the second chemical liquid are supplied to the first chemical liquid supplying position and the second chemical liquid supplying position different from the first chemical liquid supplying position, respectively.

3. The substrate processing apparatus of claim 1, wherein the first chemical liquid nozzle and the second chemical liquid nozzle are configured such that the discharging directions of the first chemical liquid and the second chemical liquid to be discharged have a component toward the outside of the radial direction of the substrate, respectively.

4. The substrate processing apparatus of claim 1, wherein the first chemical liquid nozzle and the second chemical liquid nozzle are arranged to discharge the first chemical liquid and the second chemical liquid toward the top surface of the substrate, respectively,
the substrate processing apparatus further comprising:
a first chemical liquid discharging port configured to discharge the first chemical liquid to a third chemical liquid supplying position on the bottom surface of the substrate; and
a second chemical liquid discharging port configured to discharge the second chemical liquid to a fourth chemical liquid supplying position on the bottom surface of the substrate,
wherein the third chemical liquid supplying position is located at a downstream side along the first rotation direction with respect to the first chemical liquid supplying position, with the substrate interposed therebetween, and
the fourth chemical liquid supplying position is located at a downstream side along the second rotation direction with respect to the second chemical liquid supplying position, with the substrate interposed therebetween.

5. The substrate processing apparatus of claim 1, further comprising: a ring shaped liquid receiving space configured to receive the first chemical liquid and the second chemical liquid which are scattered from the substrate; and a cup body including a drain port configured to discharge the first chemical liquid and/or the second chemical liquid,
wherein a bottom surface of the cup body is constituted by a liquid receiving bottom surface which is inclined downwardly toward the drain port, and
the liquid receiving bottom surface has a highest position between a position corresponding to the first chemical liquid supplying position and a position corresponding to the second chemical liquid supplying position, and is inclined downwardly from the highest position along the first rotation direction and the second rotation direction.

6. The substrate processing apparatus of claim 5, wherein a carrier liquid supplying port configured to supply a carrier liquid is formed in the highest position of the liquid receiving bottom surface.

7. The substrate processing apparatus of claim 1, further comprising a cover member configured to face the top surface of the substrate with a space therebetween,
wherein the first chemical liquid nozzle and the second chemical liquid nozzle are adhered to the cover member.

8. The substrate processing apparatus of claim 1, further comprising a first cleaning liquid discharging port and a second cleaning liquid discharging port which are configured to discharge a cleaning liquid toward the first chemical liquid nozzle and the second chemical liquid nozzle, respectively.

9. The substrate processing apparatus of claim 1, further comprising a nozzle driving unit configured to move the first chemical liquid nozzle and the second chemical liquid nozzle in a horizontal direction,
wherein while discharging the first chemical liquid and the second chemical liquid, the first chemical liquid nozzle and the second chemical liquid nozzle move from the outside of the substrate to positions where the first chemical liquid and the second chemical liquid are discharged toward the first chemical liquid supplying position and the second chemical liquid supplying position, respectively.

10. A substrate processing method executed in a substrate processing apparatus including a substrate holding unit, a rotation driving unit, a first chemical liquid nozzle, a second chemical liquid nozzle, a first chemical liquid supplying and a second chemical liquid supplying unit, the substrate processing method comprising:

rotating, by the rotation driving unit, the substrate holding unit that holds a substrate in a horizontal direction in a first rotation direction;

discharging, by the first chemical liquid nozzle, a first chemical liquid to a first chemical liquid supplying position on the peripheral portion of the substrate when the substrate holding unit is rotated in the first rotation direction, thereby performing a liquid processing for the peripheral portion of the substrate by the first chemical liquid while rotating the substrate held by the substrate holding unit in the first rotation direction;

rotating, by the rotation driving unit, the substrate holding unit in a second rotation direction which is opposite to the first rotation direction; and discharging, by the second chemical liquid nozzle, a second chemical liquid different from the first chemical liquid to a second chemical liquid supplying position on the peripheral portion of the substrate by a second chemical liquid nozzle when the substrate holding unit is rotated in the second rotation direction, thereby performing the liquid processing for the peripheral portion of the substrate by the second chemical liquid while rotating the substrate held by the substrate holding unit in the second rotation direction, wherein the substrate processing apparatus further comprises a control unit configured to control:

the first chemical liquid nozzle to discharge the first chemical liquid while rotating the substrate holding unit in the first rotation direction, and the second chemical liquid nozzle to discharge the second chemical liquid while rotating the substrate holding unit in the second rotation direction, and wherein the first chemical liquid supplying unit is connected to the first chemical liquid nozzle and is configured to supply the first chemical liquid to the first chemical liquid nozzle, the second chemical liquid supplying unit is connected to the second chemical liquid nozzle and is configured to supply the second chemical liquid to the second chemical liquid nozzle, the first chemical liquid nozzle is configured such that a discharging direction of the first chemical liquid to be discharged is inclined into the first rotation direction, and the second chemical liquid nozzle is configured such that a discharging direction of the second chemical liquid to be discharged is inclined into the second rotation direction.

11. The substrate processing apparatus of claim 10, wherein a central angle formed by connecting a center of the substrate, a central point of the first chemical liquid supplying position and a central point of the second chemical liquid supplying position becomes more than 180 degrees, when the central angle is viewed along the first rotation direction with respect to the first chemical liquid supplying position as a reference.

12. The substrate processing method of claim 10, wherein while discharging the first chemical liquid, the first chemical liquid nozzle moves from the outside of the substrate to a position where the first chemical liquid is discharged into the first chemical liquid supplying position, when the first chemical liquid is discharged to the first chemical liquid supplying position of the peripheral portion of the substrate.

13. The substrate processing method of claim 10, wherein the first chemical liquid nozzle and the second chemical liquid nozzle are arranged to discharge the first chemical liquid and the second chemical liquid toward the top surface of the substrate, respectively, the substrate processing method further comprising:

discharging the first chemical liquid to a third chemical liquid supplying position on the bottom surface of the substrate when the first chemical liquid nozzle discharges the first chemical liquid; and discharging the second chemical liquid to a fourth chemical liquid supplying position on the bottom surface of the substrate when the second chemical liquid nozzle discharges the second chemical liquid, wherein the third chemical liquid supplying position is located at a downstream side along the first rotation direction with respect to the first chemical liquid supplying position, with the substrate interposed therebetween, and the fourth chemical liquid supplying position is located at a downstream side along the second rotation direction with respect to the second chemical liquid supplying position, with the substrate interposed therebetween.

14. A storage medium that stores a computer program that, when executed, causes a computer to perform a substrate processing method executed in a substrate processing apparatus including a substrate holding unit, a rotation driving unit, a first chemical liquid nozzle, a second chemical liquid nozzle, a first chemical liquid supplying and a second chemical liquid supplying in using a substrate processing apparatus, the substrate processing method comprising:

rotating, by the rotation driving unit, the substrate holding unit that holds a substrate in a horizontal direction in a first rotation direction;

discharging, by the first chemical liquid nozzle, a first chemical liquid to a first chemical liquid supplying position on the peripheral portion of the substrate when the substrate holding unit is rotated in the first rotation direction, thereby performing a liquid processing for the peripheral portion of the substrate by the first chemical liquid while rotating the substrate held by the substrate holding unit in the first rotation direction;

rotating, by the rotation driving unit, the substrate holding unit in a second rotation direction which is opposite to the first rotation direction; and discharging, by the second chemical liquid nozzle, a second chemical liquid different from the first chemical liquid to a second chemical liquid supplying position on the peripheral portion of the substrate by a second chemical liquid nozzle when the substrate holding unit is rotated in the second rotation direction, thereby performing the liquid processing for the peripheral portion of the substrate by the second chemical liquid while rotating the substrate held by the substrate holding unit in the second rotation direction, wherein the substrate processing apparatus further comprises a control unit configured to control:

the first chemical liquid nozzle to discharge the first chemical liquid while rotating the substrate holding unit in the first rotation direction, and the second chemical liquid nozzle to discharge the second chemical liquid while rotating the substrate holding unit in the second rotation direction, and wherein the first chemical liquid supplying unit is connected to the first chemical liquid nozzle and is configured to supply the first chemical liquid to the first chemical liquid nozzle, the second chemical liquid supplying unit is connected to the second chemical liquid nozzle and is configured to supply the second chemical liquid to the second chemical liquid nozzle, the first chemical liquid nozzle is configured such that a discharging direction of the first chemical liquid to be discharged is inclined into the first rotation direction, and the second chemical liquid nozzle is configured such that a discharging direction of the second chemical liquid to be discharged is inclined into the second rotation direction.

15. The substrate processing apparatus of claim 1, wherein the control unit is configured to control, after the liquid processing by the first chemical liquid discharged from first chemical liquid nozzle is completed, the second chemical liquid nozzle to discharge the second chemical liquid while rotating the substrate holding unit in the second rotation direction.

* * * * *